(12) United States Patent
Deng et al.

(10) Patent No.: US 12,300,327 B2
(45) Date of Patent: May 13, 2025

(54) MEMORY DEVICE, MEMORY SYSTEM, AND OPERATION METHOD THEREOF

(71) Applicant: YANGTZE MEMORY TECHNOLOGIES CO., LTD., Wuhan (CN)

(72) Inventors: Jialiang Deng, Wuhan (CN); Xiaojiang Guo, Wuhan (CN); Bo Li, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 194 days.

(21) Appl. No.: 18/092,100

(22) Filed: Dec. 30, 2022

(65) Prior Publication Data

US 2024/0170073 A1 May 23, 2024

Related U.S. Application Data

(63) Continuation of application No. PCT/CN2022/132615, filed on Nov. 17, 2022.

(51) Int. Cl.
*G11C 16/24* (2006.01)
*G11C 11/56* (2006.01)
(Continued)

(52) U.S. Cl.
CPC .......... *G11C 16/24* (2013.01); *G11C 11/5628* (2013.01); *G11C 11/5671* (2013.01);
(Continued)

(58) Field of Classification Search
CPC ..... G11C 16/24; G11C 16/0483; G11C 16/10; G11C 16/3459; G11C 11/5628; G11C 11/5671
See application file for complete search history.

(56) References Cited

U.S. PATENT DOCUMENTS 7,372,744 B2 * 5/2008 Shiga ................... G11C 16/102
365/185.12
10,572,155 B2 * 2/2020 Jeong ..................... G06F 3/0619
(Continued)

FOREIGN PATENT DOCUMENTS

| CN | 112860177 A | 5/2021 |
| CN | 112948280 A | 6/2021 |
| CN | 115331720 A | 11/2022 |

OTHER PUBLICATIONS

International Search Report issued in corresponding International Application No. PCT/CN2022/132615, mailed Jun. 23, 2023, 3 pages.

*Primary Examiner* — Son L Mai
(74) *Attorney, Agent, or Firm* — BAYES PLLC

(57) ABSTRACT

In certain aspects, a memory device includes a plurality of memory cells and a peripheral circuit coupled to the plurality of memory cells. The peripheral circuit includes a page buffer, which includes a page buffer circuit and control logic coupled to the page buffer circuit. The page buffer circuit includes a dynamic storage unit and a first non-dynamic storage unit. The control logic is configured to determine whether an information swapping process is performed between the dynamic storage unit and the first non-dynamic storage unit based on a type of an operation to be performed on the page buffer circuit and an information storage manner between the dynamic storage unit and the first non-dynamic storage unit. The control logic is further configured to perform the operation on the page buffer circuit based on the determining whether the information swapping process is performed.

20 Claims, 16 Drawing Sheets

(51) Int. Cl.
*G11C 16/04* (2006.01)
*G11C 16/10* (2006.01)
*G11C 16/34* (2006.01)

(52) U.S. Cl.
CPC .......... *G11C 16/0483* (2013.01); *G11C 16/10* (2013.01); *G11C 16/3459* (2013.01)

(56) References Cited

U.S. PATENT DOCUMENTS

| | | | |
|---|---|---|---|
| 11,646,064 B2* | 5/2023 | Cho | G11C 16/32 365/189.05 |
| 2008/0077742 A1 | 3/2008 | Ashton et al. | |
| 2018/0122496 A1 | 5/2018 | Kang et al. | |
| 2018/0335950 A1* | 11/2018 | Jeong | G06F 3/065 |

* cited by examiner

301

TABLE 1

| LV | 0 | 1 | 2 | 3 | 4 | 5 | 6 | 7 |
|---|---|---|---|---|---|---|---|---|
| b1 | 1 | 0 | 1 | 0 | 0 | 1 | 0 | 1 |
| b2 | 1 | 0 | 0 | 1 | 0 | 1 | 1 | 0 |
| b3 | 1 | 0 | 0 | 0 | 1 | 0 | 1 | 1 |

FIG. 5B

Table 2

| Storage Unit | Sensing Storage Unit (DS) | Bias Level Storage Unit (DL) | Data Storage Unit (D₁) | Data Storage Unit (D₂) | Cache Storage Unit (DC) |
|---|---|---|---|---|---|
| Stored Info/Data | INH | Bias Level Info | LP DATA | MP DATA | UP DATA |

FIG. 8A

Table 3

| Storage Unit | Sensing Storage Unit (DS) | Bias Level Storage Unit (DL) | Data Storage Unit (D₁) | Data Storage Unit (D₂) | Data Storage Unit (D₃) | Cache Storage Unit (DC) |
|---|---|---|---|---|---|---|
| Stored Info/Data | INH | Bias Level Info | LP DATA | MP DATA | UP DATA | XP DATA |

Table 4

| Storage Unit | Sensing Storage Unit (DS) | Bias Level Storage Unit (DL) | Dynamic Storage Unit (DM) | Data Storage Unit (D₁) | Data Storage Unit (D₂) | Cache Storage Unit (DC) |
|---|---|---|---|---|---|---|
| Stored Info/Data | INH | LP DATA (or Bias Level Info) | Bias Level Info (or LP DATA) | MP DATA | UP DATA | |

FIG. 8B

Table 5

| Storage Unit | Sensing Storage Unit (DS) | Bias Level Storage Unit (DL) | Dynamic Storage Unit (DM) | Data Storage Unit (D₁) | Data Storage Unit (D₂) | Cache Storage Unit (DC) |
|---|---|---|---|---|---|---|
| Stored Info/Data | INH | LP DATA (or Bias Level Info) | Bias Level Info (or LP DATA) | MP DATA | UP DATA | XP DATA |

| Storage Unit | Sensing Storage Unit (DS) | Bias Level Storage Unit (DL) | Dynamic Storage Unit (DM) | Cache Storage Unit (DC) |
|---|---|---|---|---|
| Stored Info/Data | INH | LP DATA (or Bias Level Info) | Bias Level Info (or LP DATA) | MP DATA |

Table 6

FIG. 8C

MEMORY DEVICE, MEMORY SYSTEM, AND OPERATION METHOD THEREOF

CROSS-REFERENCE TO RELATED APPLICATIONS

This application is a continuation of Internal Application No. PCT/CN2022/132615, filed Nov. 17, 2022, entitled "MEMORY DEVICE, MEMORY SYSTEM, AND OPERATION METHOD THEREOF," which is incorporated herein by reference in its entirety.

BACKGROUND

The present disclosure relates to memory devices and operation methods thereof.

Flash memory is a low-cost, high-density, non-volatile solid-state storage medium that can be electrically erased and reprogrammed. Flash memory includes NOR Flash memory and NAND Flash memory. Various operations can be performed by Flash memory, such as read, program (write), and erase, to change the threshold voltage of each memory cell to a desired level. For NAND Flash memory, an erase operation can be performed at the block level, and a program operation or a read operation can be performed at the page level.

SUMMARY

In one aspect, a memory device includes a plurality of memory cells and a peripheral circuit coupled to the plurality of memory cells. The peripheral circuit includes a page buffer. The page buffer includes at least a page buffer circuit and control logic coupled to the page buffer circuit. The page buffer circuit is coupled to the plurality of memory cells. The page buffer circuit includes a dynamic storage unit and a first non-dynamic storage unit. The control logic is configured to control the page buffer circuit to determine whether an information swapping process is performed between the dynamic storage unit and the first non-dynamic storage unit based on a type of an operation to be performed on the page buffer circuit and an information storage manner between the dynamic storage unit and the first non-dynamic storage unit. The control logic is further configured to perform the operation on the page buffer circuit based on the determining whether the information swapping process is performed.

In some implementations, the page buffer circuit further includes a sensing node, and the dynamic storage unit and the first non-dynamic storage unit are coupled to the sensing node. The dynamic storage unit and the non-dynamic storage unit are coupled through a connection circuit.

In some implementations, the control logic is further configured to refresh the dynamic storage unit by performing the information swapping process in a predetermined time interval.

In some implementations, a first set of information and a second set of information are initially stored in the dynamic storage unit and the first non-dynamic storage unit, respectively. The control logic is configured to perform the information swapping process by swapping the first and second sets of information between the dynamic storage unit and the first non-dynamic storage unit.

In some implementations, to swap the first and second sets of information, the control logic is further configured to configure the page buffer circuit to modify a potential of the sensing node based on the first set of information in the dynamic storage unit. The control logic is also configured to re-store the second set of information in the first non-dynamic storage unit into the dynamic storage unit, and configure the page buffer circuit to re-store the first set of information into the first non-dynamic storage unit based on the potential of the sensing node.

In some implementations, the information storage manner indicates one of the followings: the first set of information is stored in the dynamic storage unit, and the second set of information is stored in the first non-dynamic storage unit; or the first set of information is stored in the first non-dynamic storage unit, and the second set of information is stored in the dynamic storage unit.

In some implementations, the type of the operation includes at least one of updating the first set of information, reading out the first set of information, updating the second set of information, or reading out the second set of information.

In some implementations, responsive to the type of the operation including updating the first set of information, to determine whether the information swapping process is performed, the control logic is further configured to determine whether the first set of information is stored in the dynamic storage unit or the first non-dynamic storage unit. Responsive to the first set of information being stored in the first non-dynamic storage unit, the control logic is configured to determine not to perform the information swapping process between the dynamic storage unit and the first non-dynamic storage unit. Or, responsive to the first set of information being stored in the dynamic storage unit, the control logic is configured to determine to perform the information swapping process between the dynamic storage unit and the first non-dynamic storage unit.

In some implementations, to perform the operation on the page buffer circuit, the control logic is further configured to, responsive to determining not to perform the information swapping process when the first set of information is stored in the first non-dynamic storage unit, update the first set of information on the first non-dynamic storage unit. Or, responsive to determining to perform the information swapping process when the first set of information is stored in the dynamic storage unit, the control logic is configured to perform the information swapping process to re-store the first set of information from the dynamic storage unit to the first non-dynamic storage unit, and update the first set of information on the first non-dynamic storage unit.

In some implementations, responsive to the type of the operation including reading out the first set of information, to determine whether the information swapping process is performed, the control logic is further configured to determine whether the first set of information is stored in the dynamic storage unit or the first non-dynamic storage unit. Responsive to the first set of information being stored in the first non-dynamic storage unit, the control logic is configured to determine to perform the information swapping process between the dynamic storage unit and the first non-dynamic storage unit. Or, responsive to the first set of information being stored in the dynamic storage unit, the control logic is configured to determine not to perform the information swapping process between the dynamic storage unit and the first non-dynamic storage unit.

In some implementations, to perform the operation on the page buffer circuit, the control logic is further configured to, responsive to determining to perform the information swapping process when the first set of information is stored in the first non-dynamic storage unit, perform the information swapping process to re-store the first set of information from the first non-dynamic storage unit to the dynamic storage unit, and read out the first set of information from the dynamic storage unit. Or, responsive to determining not to perform the information swapping process when the first set of information is stored in the dynamic storage unit, the control logic is configured to read out the first set of information from dynamic storage unit.

In some implementations, the page buffer circuit further includes a second non-dynamic storage unit. The type of the operation includes updating a third set of information stored in the second non-dynamic storage unit.

In some implementations, to determine whether the information swapping process is performed, the control logic is further configured determine whether the second set of information is stored in the dynamic storage unit or the first non-dynamic storage unit. Responsive to the second set of information being stored in the first non-dynamic storage unit, the control logic is configured to determine not to perform the information swapping process between the dynamic storage unit and the first non-dynamic storage unit. Or, responsive to the second set of information being stored in the dynamic storage unit, the control logic is configured to determine to perform the information swapping process between the dynamic storage unit and the first non-dynamic storage unit.

In some implementations, to perform the operation on the page buffer circuit, the control logic is further configured to, responsive to determining not to perform the information swapping process when the second set of information is stored in the first non-dynamic storage unit, update the second set of information on the first non-dynamic storage unit, and update the third set of information on the second non-dynamic storage unit based on the updated second set of information. Or, responsive to determining to perform the information swapping process when the second set of information is stored in the dynamic storage unit, the control logic is configured to perform the information swapping process to re-store the second set of information from the dynamic storage unit to the first non-dynamic storage unit, update the second set of information on the first non-dynamic storage unit, and update the third set of information on the second non-dynamic storage unit based on the updated second set of information.

In some implementations, the first set of information includes bias level information. The second set of information includes a portion of page data. The third set of information includes inhibit information.

In some implementations, each memory cell is configured to be programmed with a set of N-bits data, wherein N is an integer equal to or greater than 2. The first non-dynamic storage unit includes a bias level storage unit. The second non-dynamic storage unit includes a sensing storage unit. The page buffer circuit further includes a cache storage unit and N−2 data storage units.

In another aspect, a memory system includes a memory device configured to store data and a memory controller coupled to the memory device and configured to control the memory device. The memory device includes a plurality of memory cells and a peripheral circuit coupled to the plurality of memory cells. The peripheral circuit includes a page buffer, which includes at least a page buffer circuit that is coupled to the plurality of memory cells. The page buffer further includes control logic coupled to the page buffer circuit. The page buffer circuit includes a dynamic storage unit and a first non-dynamic storage unit. The control logic is configured to determine whether an information swapping process is performed between the dynamic storage unit and the first non-dynamic storage unit based on a type of an operation to be performed on the page buffer circuit and an information storage manner between the dynamic storage unit and the first non-dynamic storage unit. The control logic is further configured to perform the operation on the page buffer circuit based on the determining whether the information swapping process is performed.

In some implementations, the page buffer circuit further includes a sensing node, and the dynamic storage unit and the first non-dynamic storage unit are coupled to the sensing node. The dynamic storage unit and the non-dynamic storage unit are coupled through a connection circuit.

In some implementations, the control logic is further configured to refresh the dynamic storage unit by performing the information swapping process in a predetermined time interval.

In some implementations, a first set of information and a second set of information are initially stored in the dynamic storage unit and the first non-dynamic storage unit, respectively. The control logic is configured to perform the information swapping process by swapping the first and second sets of information between the dynamic storage unit and the first non-dynamic storage unit.

In some implementations, to swap the first and second sets of information, the control logic is further configured to configure the page buffer circuit to modify a potential of the sensing node based on the first set of information in the dynamic storage unit. The control logic is also configured to re-store the second set of information in the first non-dynamic storage unit into the dynamic storage unit, and configure the page buffer circuit to re-store the first set of information into the first non-dynamic storage unit based on the potential of the sensing node.

In some implementations, the information storage manner indicates one of the followings: the first set of information is stored in the dynamic storage unit, and the second set of information is stored in the first non-dynamic storage unit; or the first set of information is stored in the first non-dynamic storage unit, and the second set of information is stored in the dynamic storage unit.

In some implementations, the type of the operation includes at least one of updating the first set of information, reading out the first set of information, updating the second set of information, or reading out the second set of information.

In some implementations, responsive to the type of the operation including updating the first set of information, to determine whether the information swapping process is performed, the control logic is further configured to determine whether the first set of information is stored in the dynamic storage unit or the first non-dynamic storage unit. Responsive to the first set of information being stored in the first non-dynamic storage unit, the control logic is configured to determine not to perform the information swapping process between the dynamic storage unit and the first non-dynamic storage unit. Or, responsive to the first set of information being stored in the dynamic storage unit, the control logic is configured to determine to perform the information swapping process between the dynamic storage unit and the first non-dynamic storage unit.

In some implementations, to perform the operation on the page buffer circuit, the control logic is further configured to, responsive to determining not to perform the information swapping process when the first set of information is stored in the first non-dynamic storage unit, update the first set of information on the first non-dynamic storage unit. Or, responsive to determining to perform the information swapping process when the first set of information is stored in the dynamic storage unit, the control logic is configured to perform the information swapping process to re-store the first set of information from the dynamic storage unit to the first non-dynamic storage unit, and update the first set of information on the first non-dynamic storage unit.

In some implementations, responsive to the type of the operation including reading out the first set of information, to determine whether the information swapping process is performed, the control logic is further configured to determine whether the first set of information is stored in the dynamic storage unit or the first non-dynamic storage unit. Responsive to the first set of information being stored in the first non-dynamic storage unit, the control logic is configured to determine to perform the information swapping process between the dynamic storage unit and the first non-dynamic storage unit. Or, responsive to the first set of information being stored in the dynamic storage unit, the control logic is configured to determine not to perform the information swapping process between the dynamic storage unit and the first non-dynamic storage unit.

In some implementations, to perform the operation on the page buffer circuit, the control logic is further configured to, responsive to determining to perform the information swapping process when the first set of information is stored in the first non-dynamic storage unit, perform the information swapping process to re-store the first set of information from the first non-dynamic storage unit to the dynamic storage unit, and read out the first set of information from the dynamic storage unit. Or, responsive to determining not to perform the information swapping process when the first set of information is stored in the dynamic storage unit, the control logic is configured to read out the first set of information from dynamic storage unit.

In some implementations, the page buffer circuit further includes a second non-dynamic storage unit. The type of the operation includes updating a third set of information stored in the second non-dynamic storage unit.

In some implementations, to determine whether the information swapping process is performed, the control logic is further configured determine whether the second set of information is stored in the dynamic storage unit or the first non-dynamic storage unit. Responsive to the second set of information being stored in the first non-dynamic storage unit, the control logic is configured to determine not to perform the information swapping process between the dynamic storage unit and the first non-dynamic storage unit. Or, responsive to the second set of information being stored in the dynamic storage unit, the control logic is configured to determine to perform the information swapping process between the dynamic storage unit and the first non-dynamic storage unit.

In some implementations, to perform the operation on the page buffer circuit, the control logic is further configured to, responsive to determining not to perform the information swapping process when the second set of information is stored in the first non-dynamic storage unit, update the second set of information on the first non-dynamic storage unit, and update the third set of information on the second non-dynamic storage unit based on the updated second set of information. Or, responsive to determining to perform the information swapping process when the second set of information is stored in the dynamic storage unit, the control logic is configured to perform the information swapping process to re-store the second set of information from the dynamic storage unit to the first non-dynamic storage unit, update the second set of information on the first non-dynamic storage unit, and update the third set of information on the second non-dynamic storage unit based on the updated second set of information.

In some implementations, the first set of information includes bias level information. The second set of information includes a portion of page data. The third set of information includes inhibit information.

In some implementations, each memory cell is configured to be programmed with a set of N-bits data, wherein N is an integer equal to or greater than 2. The first non-dynamic storage unit includes a bias level storage unit. The second non-dynamic storage unit includes a sensing storage unit. The page buffer circuit further includes a cache storage unit and N−2 data storage units.

In still another aspect, a method for operating a memory device is disclosed. The memory device includes a plurality of memory cells coupled to a page buffer circuit in a page buffer. The page buffer circuit includes a dynamic storage unit and a first non-dynamic storage unit. The method includes determining whether an information swapping process is performed between the dynamic storage unit and the first non-dynamic storage unit based on a type of an operation to be performed on the page buffer circuit and an information storage manner between the dynamic storage unit and the first non-dynamic storage unit. The method further includes performing the operation on the page buffer circuit based on the determining whether the information swapping process is performed.

In some implementations, the dynamic storage unit is refreshed by performing the information swapping process in a predetermined time interval.

In some implementations, a first set of information and a second set of information are initially stored in the dynamic storage unit and the first non-dynamic storage unit, respectively. The information swapping process is performed by swapping the first and second sets of information between the dynamic storage unit and the first non-dynamic storage unit.

In some implementations, swapping the first and second sets of information includes: configuring the page buffer circuit to modify a potential of the sensing node based on the first set of information in the dynamic storage unit; restoring the second set of information in the first non-dynamic storage unit into the dynamic storage unit; and configuring the page buffer circuit to re-store the first set of information into the first non-dynamic storage unit based on the potential of the sensing node.

In some implementations, the information storage manner indicates one of the followings: the first set of information is stored in the dynamic storage unit, and the second set of information is stored in the first non-dynamic storage unit; or, the first set of information is stored in the first non-dynamic storage unit, and the second set of information is stored in the dynamic storage unit.

In some implementations, the type of the operation includes at least one of updating the first set of information, reading out the first set of information, updating the second set of information, or reading out the second set of information.

In some implementations, responsive to the type of the operation including updating the first set of information, determining whether the information swapping process is performed includes: determining whether the first set of information is stored in the dynamic storage unit or the first non-dynamic storage unit; responsive to the first set of information being stored in the first non-dynamic storage unit, determining not to perform the information swapping process between the dynamic storage unit and the first non-dynamic storage unit; or, responsive to the first set of information being stored in the dynamic storage unit, determining to perform the information swapping process between the dynamic storage unit and the first non-dynamic storage unit.

In some implementations, performing the operation on the page buffer circuit includes: responsive to determining not to perform the information swapping process when the first set of information is stored in the first non-dynamic storage unit, updating the first set of information on the first non-dynamic storage unit; or, responsive to determining to perform the information swapping process when the first set of information is stored in the dynamic storage unit, performing the information swapping process to re-store the first set of information from the dynamic storage unit to the first non-dynamic storage unit, and updating the first set of information on the first non-dynamic storage unit.

In some implementations, responsive to the type of the operation including reading out the first set of information, determining whether the information swapping process is performed includes: determining whether the first set of information is stored in the dynamic storage unit or the first non-dynamic storage unit; responsive to the first set of information being stored in the first non-dynamic storage unit, determining to perform the information swapping process between the dynamic storage unit and the first non-dynamic storage unit; or, responsive to the first set of information being stored in the dynamic storage unit, determining not to perform the information swapping process between the dynamic storage unit and the first non-dynamic storage unit.

In some implementations, performing the operation on the page buffer circuit includes: responsive to determining to perform the information swapping process when the first set of information is stored in the first non-dynamic storage unit, performing the information swapping process to re-store the first set of information from the first non-dynamic storage unit to the dynamic storage unit, and reading out the first set of information from the dynamic storage unit; or, responsive to determining not to perform the information swapping process when the first set of information is stored in the dynamic storage unit, reading out the first set of information from dynamic storage unit.

In some implementations, the page buffer circuit further includes a second non-dynamic storage unit. The type of the operation includes updating a third set of information stored in the second non-dynamic storage unit.

In some implementations, determining whether the information swapping process is performed includes: determining whether the second set of information is stored in the dynamic storage unit or the first non-dynamic storage unit; responsive to the second set of information being stored in the first non-dynamic storage unit, determining not to perform the information swapping process between the dynamic storage unit and the first non-dynamic storage unit; or, responsive to the second set of information being stored in the dynamic storage unit, determining to perform the information swapping process between the dynamic storage unit and the first non-dynamic storage unit.

In some implementations, performing the operation on the page buffer circuit includes: responsive to determining not to perform the information swapping process when the second set of information is stored in the first non-dynamic storage unit, updating the second set of information on the first non-dynamic storage unit, and updating the third set of information on the second non-dynamic storage unit based on the updated second set of information; or, responsive to determining to perform the information swapping process when the second set of information is stored in the dynamic storage unit, performing the information swapping process to re-store the second set of information from the dynamic storage unit to the first non-dynamic storage unit, updating the second set of information on the first non-dynamic storage unit, and updating the third set of information on the second non-dynamic storage unit based on the updated second set of information.

In some implementations, the first set of information includes bias level information. The second set of information includes a portion of page data. The third set of information includes inhibit information.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIG. 5B illustrates a graphical representation illustrating exemplary three bits of binary values for a set of 3-bits data, according to some aspects of the present disclosure.

FIG. 8A is a graphical representation illustrating exemplary information stored in a page buffer circuit, according to some examples.

FIGS. 8B-8C are graphical representations illustrating exemplary information stored in a page buffer circuit disclosed herein, according to some aspects of the present disclosure.

Figure 1:
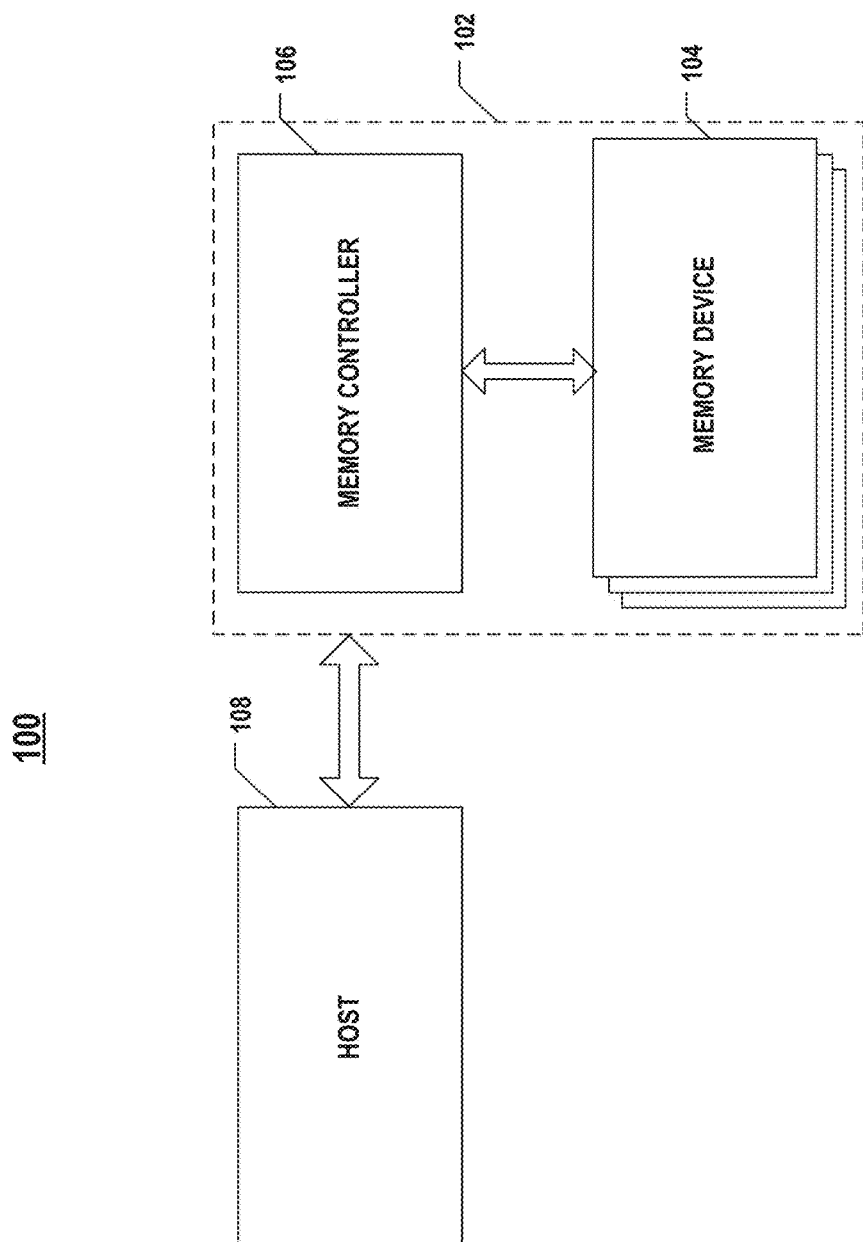
FIG. 1 illustrates a block diagram of a system having a memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

In some applications, a triple-level cell (TLC) NAND Flash memory device may have at least 5 non-dynamic storage units in each page buffer circuit for storing program information (e.g., as shown in Table 2 of FIG. 8A below). For example, the 5 non-dynamic storage units may be 5 latches including a sensing latch, a bias level latch, a first data latch, a second data latch, and a cache latch. A quad-level cell (QLC) NAND Flash memory device may have at least 6 non-dynamic storage units in each page buffer circuit for storing program information (e.g., as shown in Table 3 of FIG. 8A below). For example, the 6 non-dynamic storage units may be 6 latches including a sensing latch, a bias level latch, a first data latch, a second data latch, a third data latch, and a cache latch.

The present disclosure introduces an architecture that adopts a dynamic storage unit to replace one of the non-dynamic storage units in the page buffer circuit of the memory device, so that the total number of the non-dynamic storage units applied in the memory device can be reduced. Since the dynamic storage unit has a smaller area than a non-dynamic storage unit, the chip area of the memory device disclosed herein can be reduced, and the cost of the memory device can also be reduced. The competitiveness of the memory device disclosed herein can be improved thereof.

For example, by adopting the dynamic storage unit, a TLC NAND Flash memory device disclosed herein may only have 4 non-dynamic storage units in each page buffer circuit for storing program information (e.g., as shown in Table 4 of FIG. 8B below), including the sensing latch, the bias level latch, the first data latch, and the cache latch. The second data latch shown in Table 2 of FIG. 8A is not included. A QLC NAND Flash memory device disclosed herein may only have 5 non-dynamic storage units in each page buffer circuit for storing program information (e.g., as shown in Table 5 of FIG. 8B below), including the sensing latch, the bias level latch, the first data latch, the second data latch, and the cache latch. The third data latch shown in Table 3 of FIG. 8A is not included. Thus, by adopting the dynamic storage unit, a chip area of the TLC or QLC NAND Flash memory device disclosed herein can be reduced.

It is contemplated that each non-dynamic storage unit may be any circuit that has two stable states for storing a single bit of data, such as a latch or a flip-flop. Different from the non-dynamic storage units, which can store information permanently (e.g., for an amount of time greater than a predetermined threshold), the dynamic storage unit may store information temporarily by utilizing its parasitic capacitance for a limited amount of time (such as 20 microseconds (μs) or another amount of time less than 40 μs). As a result, the dynamic storage unit may need to be refreshed regularly so that the information stored in the dynamic storage unit may not be lost. Consistent with some aspects of the present disclosure, the dynamic storage unit can be refreshed by performing an information swapping process in a predetermined time interval (e.g., every 20 μs), which is described below in more detail.

FIG. 1 illustrates a block diagram of an exemplary system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive data to or from memory devices 104. In order to send or receive data to or from memory devices 104, host 108 can send instructions to memory system 102 besides the data.

Memory device 104 can be any memory device disclosed in the present disclosure. For example, memory device 104 can be a NAND Flash memory device, and can support the features and functionality disclosed herein. Memory device 104 can include memory cells, for example, in NAND memory strings.

Memory controller 106 is coupled to memory device 104 and host 108 and is configured to control memory device 104, according to some implementations. Memory controller 106 can manage the data stored in memory device 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment SSDs or embedded multi-media-cards (eMMCs) used as data storage for mobile devices, such as smartphones, tablets, laptop computers, etc., and enterprise storage arrays. Memory controller 106 can be configured to control operations of memory device 104, such as read, erase, and program operations. For example, based on the instructions received from host 108, memory controller 106 may transmit various commands to memory device 104, e.g., a program command, a read command, an erase command, etc., to control the operations of memory device 104. Memory controller 106 is described below in more detail with reference to FIG. 6B.

Memory controller 106 can also be configured to manage various functions with respect to the data stored or to be stored in memory device 104 including, but not limited to, bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, formatting memory device 104. Memory controller 106 can communicate with an external device (e.g., host 108) according to a particular communication protocol. For example, memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 2A:
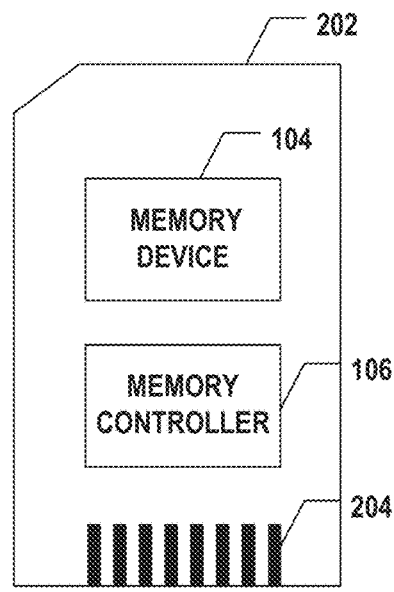
FIG. 2A illustrates a diagram of a memory card having a memory device, according to some aspects of the present disclosure.
Figure 2B:
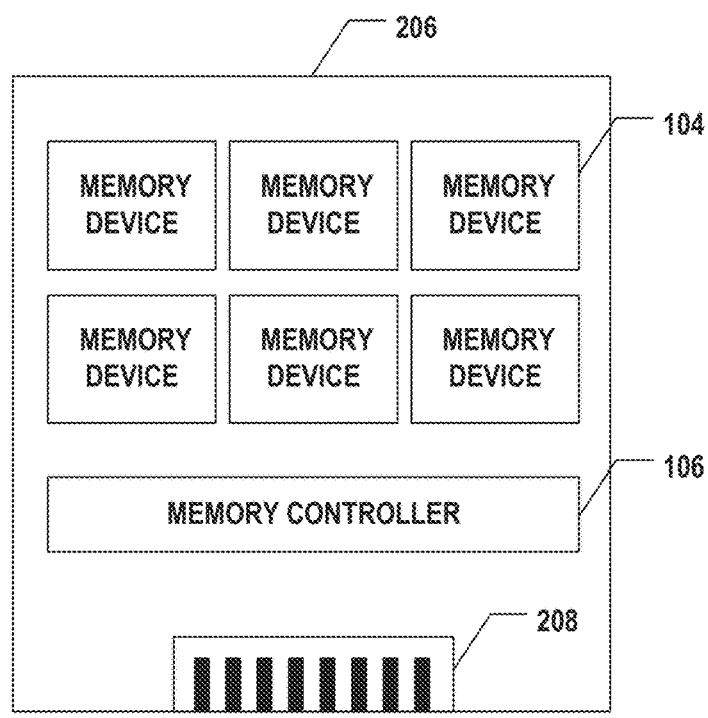
FIG. 2B illustrates a diagram of a solid-state drive (SSD) having a memory device, according to some aspects of the present disclosure.

Memory controller 106 and one or more memory devices 104 can be integrated into various types of storage devices, for example, be included in the same package, such as a universal Flash storage (UFS) package or an eMMC package. That is, memory system 102 can be implemented and packaged into different types of end electronic products. In one example as shown in FIG. 2A, memory controller 106 and a single memory device 104 may be integrated into a memory card 202. Memory card 202 can include a PC card (PCMCIA, personal computer memory card international association), a CF card, a smart media (SM) card, a memory stick, a multimedia card (MMC, MMCmicro), an SD card (SD, miniSD, microSD, SDHC), a UFS, etc. Memory card 202 can further include a memory card connector 204 configured to couple memory card 202 to a host (e.g., host 108 in FIG. 1). In another example as shown in FIG. 2B, memory controller 106 and multiple memory devices 104 may be integrated into an SSD 206. SSD 206 can further include an SSD connector 208 configured to couple SSD 206 to a host (e.g., host 108 in FIG. 1). In some implementations, the storage capacity and/or the operation speed of SSD 206 is greater than those of memory card 202.

Figure 3:
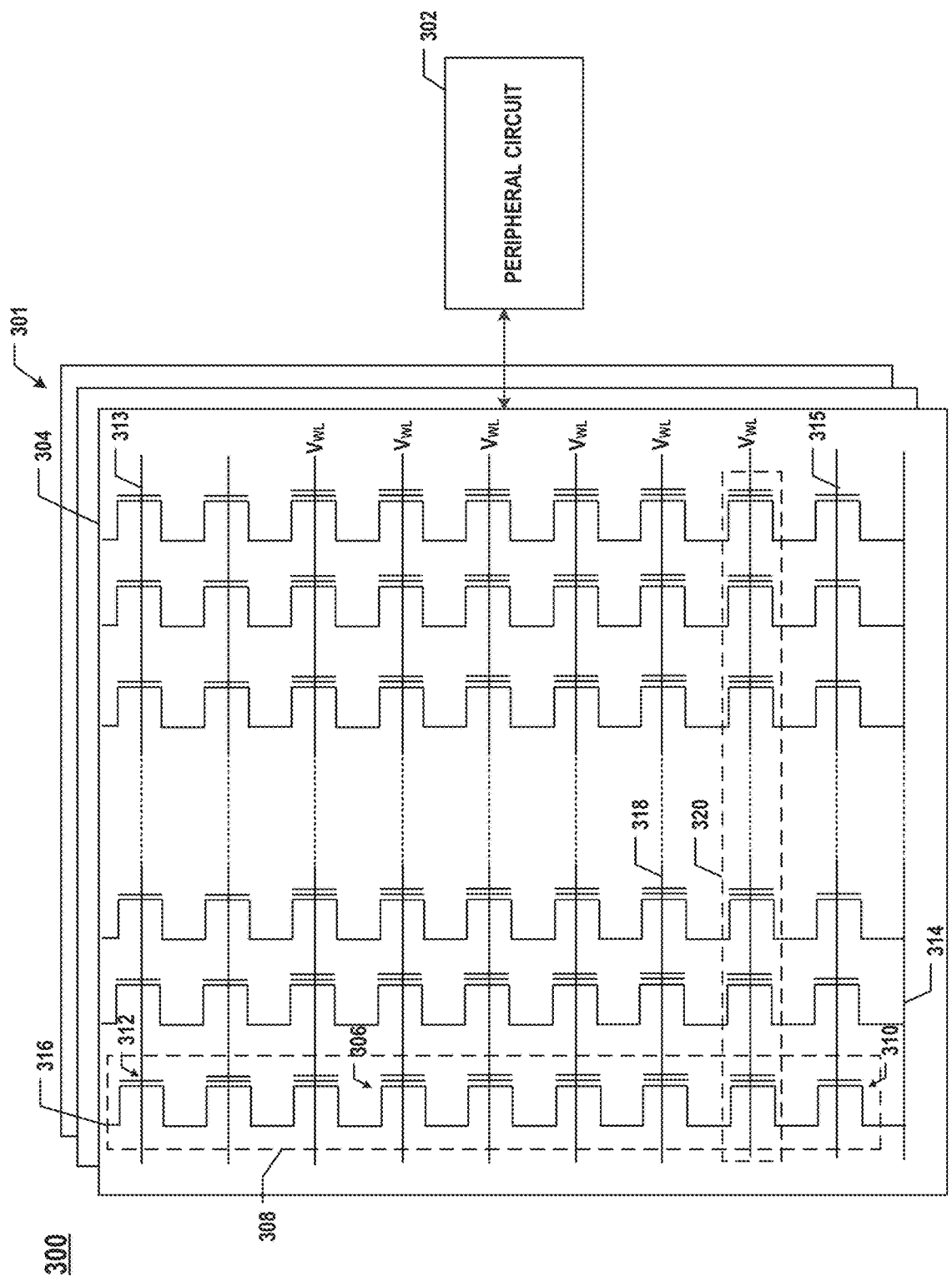
FIG. 3 illustrates a schematic diagram of a memory device including peripheral circuits, according to some aspects of the present disclosure.

FIG. 3 illustrates a schematic circuit diagram of an exemplary memory device 300 including peripheral circuits 302, according to some aspects of the present disclosure. Memory device 300 can be an example of memory device 104 in FIG. 1. Memory device 300 can include a memory cell array 301 and peripheral circuits 302 coupled to memory cell array 301. Memory cell array 301 can be a NAND Flash memory cell array in which memory cells 306 are provided in an array of NAND memory strings 308 each extending vertically above a substrate (not shown). In some implementations, each NAND memory string 308 includes a plurality of memory cells 306 coupled in series and stacked vertically. Each memory cell 306 can hold a continuous, analog value, such as an electrical voltage or charge, that depends on the number of electrons trapped within a region of memory cell 306. Each memory cell 306 can be either a floating gate type of memory cell including a floating-gate transistor or a charge trap type of memory cell including a charge-trap transistor.

In some implementations, each memory cell 306 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 306 is a multi-level cell (MLC) that is capable of storing more than a single bit of data in more than four memory states. For example, the MLC can store two bits per cell, three bits per cell (also known as TLC), or four bits per cell (also known as QLC). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 3, each NAND memory string 308 can also include a source select gate (SSG) transistor 310 at its source end and a drain select gate (DSG) transistor 312 at its drain end. SSG transistor 310 and DSG transistor 312 can be configured to activate select NAND memory strings 308 (columns of the array) during read and program operations. In some implementations, the sources of NAND memory strings 308 in the same block 304 are coupled through a same source line (SL) 314, e.g., a common SL. In other words, all NAND memory strings 308 in the same block 304 have an array common source (AC S), according to some implementations. The drain of each NAND memory string 308 is coupled to a respective bit line 316 from which data can be read or written via an output bus (not shown), according to some implementations. In some implementations, each NAND memory string 308 is configured to be selected or deselected by applying a DSG select voltage or a DSG unselect voltage to the gate of respective DSG transistor 312 through one or more DSG lines 313 and/or by applying an SSG select voltage or an SSG unselect voltage to the gate of respective SSG transistor 310 through one or more SSG lines 315.

As shown in FIG. 3, NAND memory strings 308 can be organized into multiple blocks 304, each of which can have a common source line 314, e.g., coupled to an ACS. In some implementations, each block 304 is the basic data unit for erase operations, i.e., all memory cells 306 on the same block 304 are erased at the same time. To erase memory cells 306 in a select block 304, source lines 314 coupled to select block 304 as well as unselect blocks 304 in the same plane as select block 304 can be biased with an erase voltage (Vers), such as a high positive voltage (e.g., 20 V or more). Memory cells 306 of adjacent NAND memory strings 308 can be coupled through word lines 318 that select which row of memory cells 306 is affected by read and program operations. In some implementations, each word line 318 is coupled to a page 320 of memory cells 306, which is the basic data unit for program and read operations. The size of one page 320 in bits can relate to the number of NAND memory strings 308 coupled by word line 318 in one block 304. Each word line 318 can include a plurality of control gates (gate electrodes) at each memory cell 306 on respective page 320 and a gate line coupling the control gates.

Figure 4A:
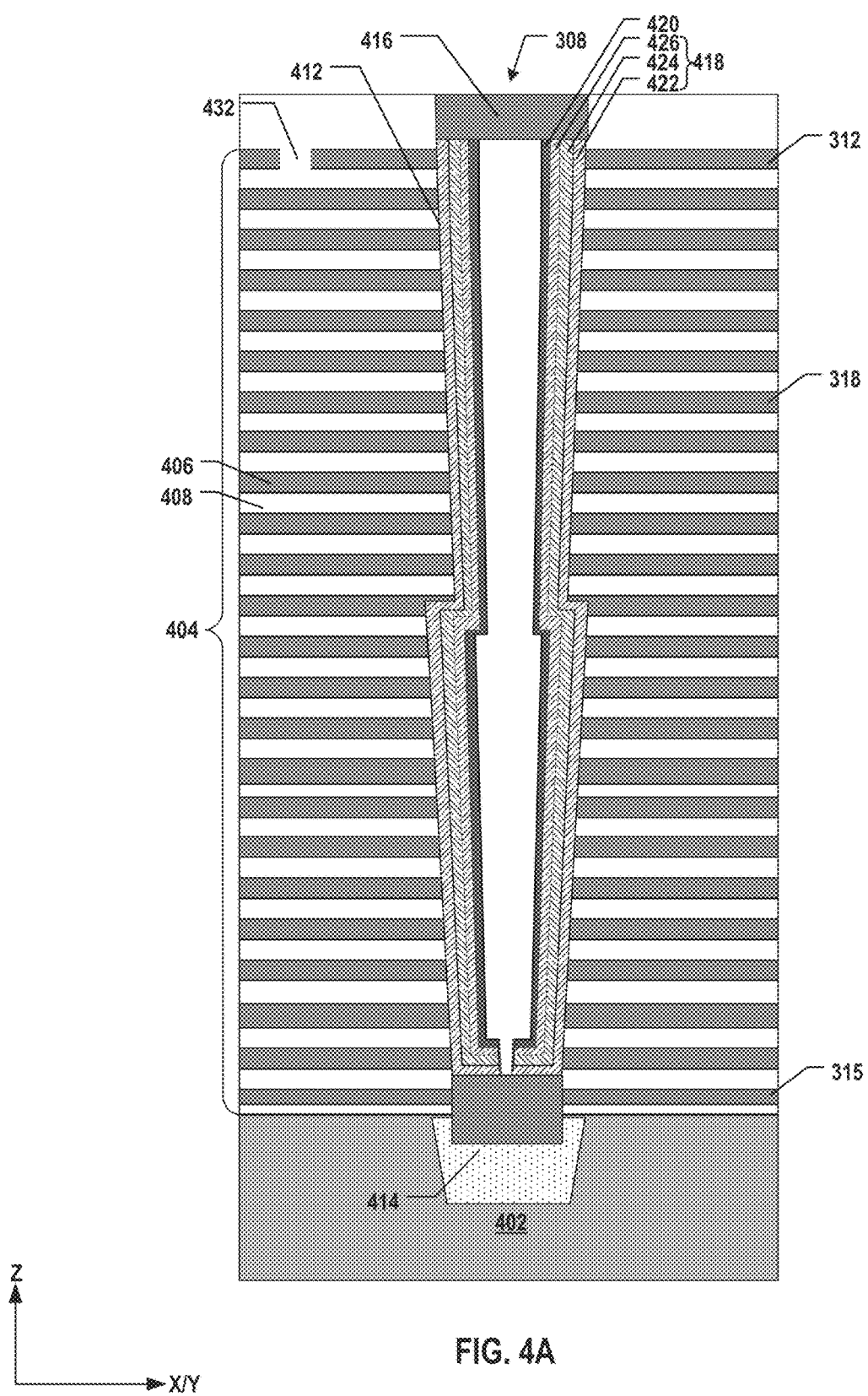
FIGS. 4A and 4B illustrate a side view and a plan view of cross-sections of a memory cell array including a NAND memory string, respectively, according to some aspects of the present disclosure.
Figure 4B:
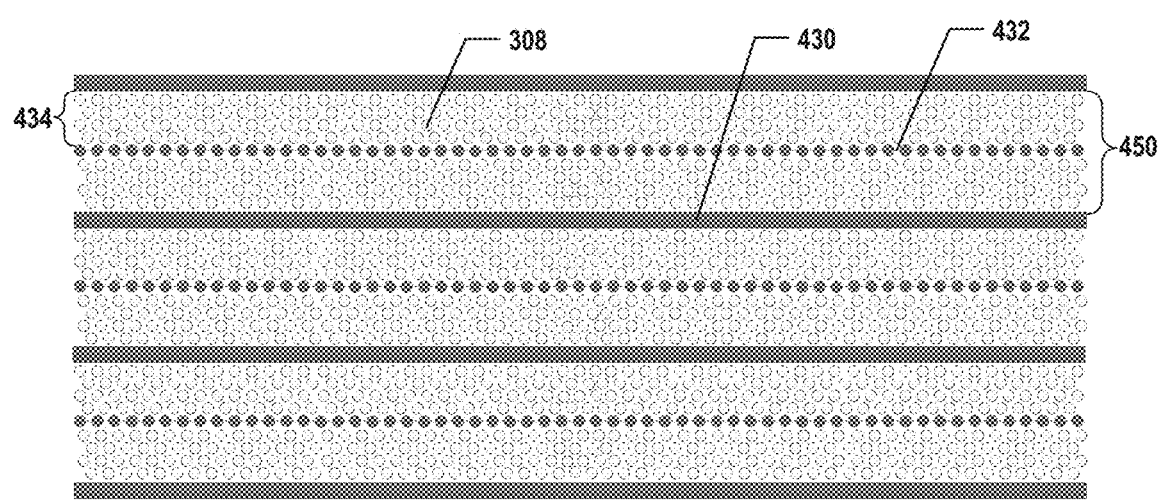

FIGS. 4A and 4B illustrate a side view and a plan view of cross-sections of an exemplary memory cell array 301 including NAND memory strings 308, respectively, according to some aspects of the present disclosure. FIGS. 4A-4B and the relevant description for FIGS. 4A-4B are for illustration purposes only, which are not intended to limit the structure of the memory cell array disclosed herein. It is understood that any other structure (e.g., any other NAND structure) can be adopted in a memory device disclosed herein. As shown in FIG. 4A, NAND memory string 308 can extend vertically through a memory stack 404 above a substrate 402. Substrate 402 can include silicon (e.g., single crystalline silicon), silicon germanium (SiGe), gallium arsenide (GaAs), germanium (Ge), silicon on insulator (SOI), germanium on insulator (GOI), or any other suitable materials. It is noted that x, y, and z axes are included in FIG. 4A to further illustrate the spatial relationship of the components in a memory device. Substrate 402 includes two lateral surfaces extending laterally in the x-y plane: a top surface on the front side of the wafer on which the memory device can be formed, and a bottom surface on the backside opposite to the front side of the wafer. The z-axis is perpendicular to both the x and y axes. As used herein, whether one component (e.g., a layer or a device) is "on," "above," or "below" another component (e.g., a layer or a device) of the memory device is determined relative to substrate 402 of the memory device in the z-direction (the vertical direction perpendicular to the x-y plane) when substrate 402 is positioned in the lowest plane of the memory device in the z-direction. The same notion for describing the spatial relationships is applied throughout the present disclosure.

Memory stack 404 can include interleaved gate conductive layers 406 and gate-to-gate dielectric layers 408. The number of the pairs of gate conductive layers 406 and gate-to-gate dielectric layers 408 in memory stack 404 can determine the number of memory cells 306 in memory cell array 301. Gate conductive layer 406 can include conductive materials including, but not limited to, tungsten (W), cobalt (Co), copper (Cu), aluminum (Al), polysilicon, doped silicon, silicides, or any combination thereof. In some implementations, each gate conductive layer 406 includes a metal layer, such as a tungsten layer. In some implementations, each gate conductive layer 406 includes a doped polysilicon layer. Each gate conductive layer 406 can include the control gates of memory cells 306, the gates of DSG transistors 312, or the gates of SSG transistors 310, and can extend laterally as DSG line 313 in the upper portion of memory stack 404, SSG line 315 in the lower portion of memory stack 404, or word line 318 between DSG line 313 and SSG line 315. It is understood that although one SSG line 315 and one DSG line 313 are shown in FIG. 4A, the number of SSG lines 315 and the number of DSG lines 313 (as well as the numbers of SSG transistors 310 and DSG transistors 312 coupled to the SSG lines 315 and DSG lines 313, respectively) may vary in other examples.

As shown in FIG. 4A, NAND memory string 308 includes a channel structure 412 extending vertically through memory stack 404. In some implementations, channel structure 412 includes a channel opening filled with semiconductor material(s) (e.g., as a semiconductor channel 420) and dielectric material(s) (e.g., as a memory film 418). In some implementations, semiconductor channel 420 includes silicon, such as polysilicon. In some implementations, memory film 418 is a composite dielectric layer including a tunneling layer 426, a storage layer 424 (also known as a "charge trap layer"), and a blocking layer 422. Channel structure 412 can have a cylinder shape (e.g., a pillar shape). Semiconductor channel 420, tunneling layer 426, storage layer 424, blocking layer 422 are arranged radially from the center toward the outer surface of the pillar in this order, according to some implementations. Tunneling layer 426 can include silicon oxide, silicon oxynitride, or any combination thereof. Storage layer 424 can include silicon nitride, silicon oxynitride, silicon, or any combination thereof. Blocking layer 422 can include silicon oxide, silicon oxynitride, high dielectric constant (high-k) dielectrics, or any combination thereof. In one example, memory film 418 may include a composite layer of silicon oxide/silicon oxynitride/silicon oxide (ONO).

As shown in FIG. 4A, a well 414 (e.g., a P-well and/or an N-well) is formed in substrate 402, and the source of NAND memory string 308 is in contact with well 414, according to some implementations. For example, source line 314 may be coupled to well 414 to apply an erase voltage to well 414, i.e., the source of NAND memory string 308, during erase operations.

As shown in the plan view of FIG. 4B, NAND memory strings 308 of memory cell array 301 can be arranged into areas 450 by slit structures 430 (e.g., gate line slits (GLSs)), which electrically separate word lines 318 between adjacent areas 450, such that each area 450 can be individually controlled in read, program, and erase operations. In one example, each slit structure 430 may extend along the x-direction (e.g., the word line direction), and multiple areas 450 may be arranged along the y-direction (e.g., the bit line direction). In some implementations, each area 450 can be further divided into smaller areas (e.g., fingers 434) by DSG cuts 432, which electrically separate DSG lines 313 between adjacent fingers 434, such that DSG lines 313 in different fingers 434 may be individually controlled in read and program operations.

Figure 5A:
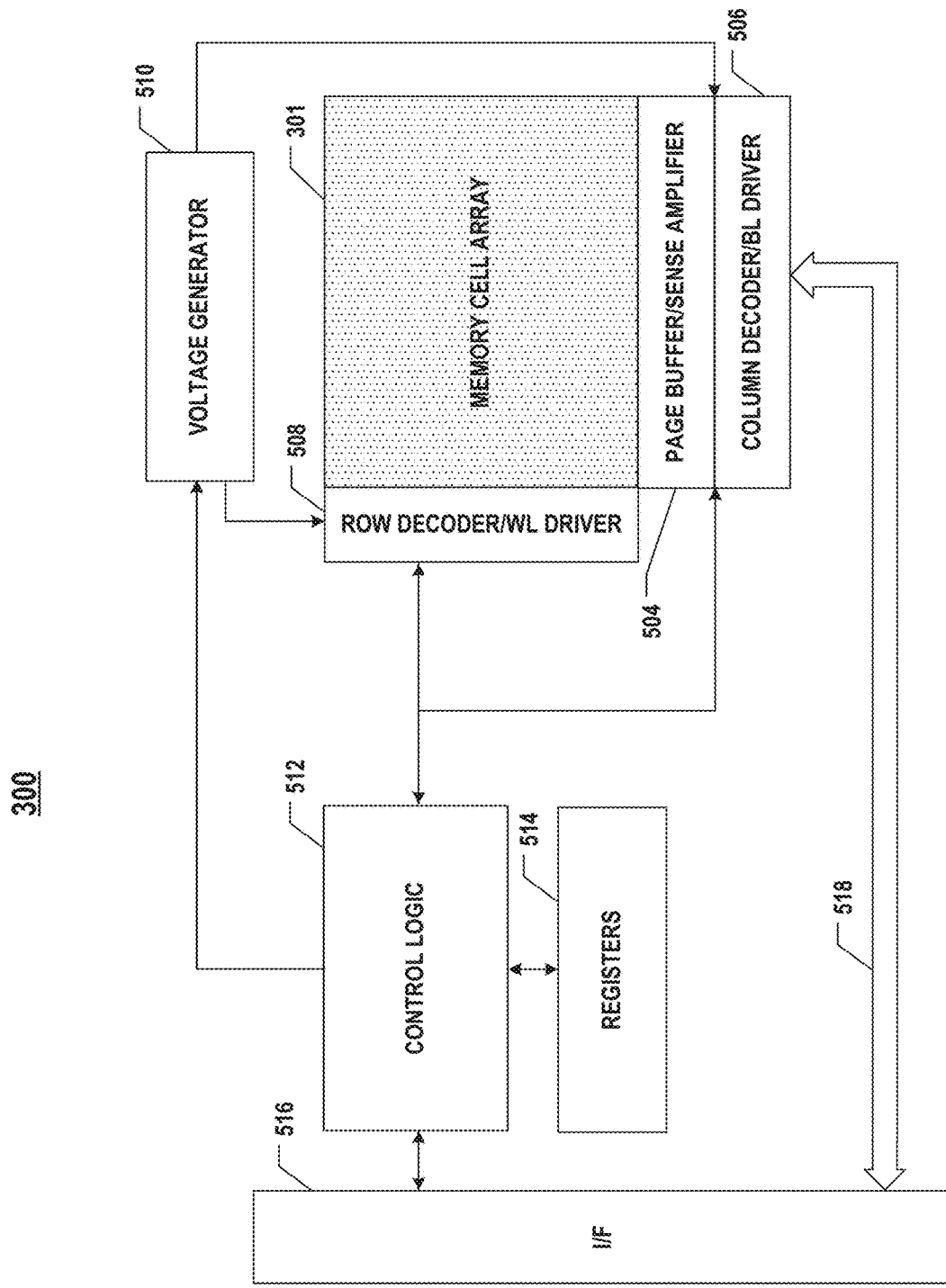
FIG. 5A illustrates a block diagram of a memory device including a memory cell array and peripheral circuits, according to some aspects of the present disclosure.

Referring back to FIG. 3, peripheral circuits 302 can be coupled to memory cell array 301 through bit lines 316, word lines 318, source lines 314, SSG lines 315, and DSG lines 313. Peripheral circuits 302 can include any suitable analog, digital, and mixed-signal circuits for facilitating the operations of memory cell array 301 by applying and sensing voltage signals and/or current signals to and from each target (select) memory cell 306 through bit lines 316, word lines 318, source lines 314, SSG lines 315, and DSG lines 313. Peripheral circuits 302 can include various types of peripheral circuits formed using metal-oxide-semiconductor (MOS) technologies. For example, FIG. 5A illustrates some exemplary peripheral circuits including a page buffer/sense amplifier 504, a column decoder/bit line driver 506, a row decoder/word line driver 508, a voltage generator 510, control logic 512, registers 514, an interface 516, and a data bus 518. It is understood that in some examples, additional peripheral circuits not shown in FIG. 5A may be included as well.

Page buffer/sense amplifier 504 can be configured to read and program (write) data from and to memory cell array 301 according to the control signals from control logic 512. In one example, page buffer/sense amplifier 504 may store one page of program data (write data) to be programmed into one page 320 of memory cell array 301. In another example, page buffer/sense amplifier 504 may perform program verify operations to ensure that the data has been properly programmed into select memory cells 306 coupled to select word lines 318. In still another example, page buffer/sense amplifier 504 may also sense the low power signals from bit line 316 that represents a data bit stored in memory cell 306 and amplify the small voltage swing to recognizable logic levels in a read operation. Column decoder/bit line driver 506 can be configured to be controlled by control logic 512 and select one or more NAND memory strings 308 by applying bit line voltages generated from voltage generator 510.

Row decoder/word line driver 508 can be configured to be controlled according to the control signals by control logic 512 and select/unselect blocks 304 of memory cell array 301 and select/unselect word lines 318 of block 304. Row decoder/word line driver 508 can be further configured to drive word lines 318 using word line voltages generated from voltage generator 510. In some implementations, row decoder/word line driver 508 can also select/deselect and drive SSG lines 315, and DSG lines 313 as well using SSG voltages and DSG voltages generated from voltage generator 510.

Voltage generator 510 can be configured to be controlled by control logic 512 and generate the various word line voltages (e.g., read voltage, program voltage, pass voltage, verification voltage), SSG voltages (e.g., select/unselect voltages), DSG voltages (e.g., select/unselect voltages), bit line voltages (e.g., ground voltage), and source line voltages (e.g., ground voltage) to be supplied to memory cell array 301.

Control logic 512 can be coupled to each peripheral circuit described above and configured to control the operations of each peripheral circuit. Registers 514 can be coupled to control logic 512 and include status registers, command registers, and address registers for storing status information, command operation codes (OP codes), and command addresses for controlling the operations of each peripheral circuit.

In some implementations, control logic 512 can receive a program command issued by a memory controller (e.g., memory controller 106 in FIG. 1) and send control signals to various peripheral circuits, such as row decoder/word line driver 508, column decoder/bit line driver 506, and voltage generator 510 to perform the program operation on select memory cells 306 coupled to select word line 318. In some implementations, during a read operation, a data page having N sets of the N-bits data stored in a select row of memory cells 306 coupled to select word line 318 can be read out from select row of memory cells 306 though corresponding bit lines 316. N is an integer greater than 1. For example, control logic 512 can be configured to send control signals (e.g., enable signals) to page buffer/sense amplifier 504 (and any other suitable peripheral circuit) to allow page buffer/sense amplifier 504 to read the data page from select row of memory cells 306 and output the data page to interface 516. Control logic 512 is described below in more detail with reference to FIGS. 6A and 7A-11.

Interface 516 can be coupled to control logic 512 and act as a control buffer to buffer and relay control commands (e.g., program command, read command) received from a memory controller (e.g., memory controller 106 in FIG. 1) to control logic 512 and data received from control logic 512 to the memory controller. Interface 516 can also be coupled to column decoder/bit line driver 506 via data bus 518 and act as a data input/output (I/O) interface and a data buffer to buffer and relay the data to and from memory cell array 301.

Each memory cell 306 in memory cell array 301 can be configured to store a set of N-bits data in one of $2^N$ levels (e.g., N=2 for MLCs, N=3 for TLCs, N=4 for QLCs, etc.). $2^N$ sets of the N-bits data may correspond to the $2^N$ levels, respectively. Each level can correspond to one of $2^N$ threshold voltage (Vth) ranges of memory cells 306. Taking TLCs, where N=3, for example, memory cell 306 may be programmed into one of 8 levels, including one level of the erased state and 7 levels of the programmed states. Each level may correspond to a respective threshold voltage (Vth) range of memory cells 306. For example, the level corresponding to the lowest threshold voltage range may be considered as level 0, the level corresponding to the second-lowest threshold voltage range may be considered as level 1, and so until level 7 corresponds to the highest threshold voltage range.

On the other hand, each level can correspond to one of the $2^N$ sets of N-bits data that is to be stored in select memory cell 306. In some implementations, the $2^N$ sets of N-bits data may be represented by (in the form of) a gray code. A gray code (a.k.a. reflected binary code (RBC) or reflected binary (RB)) is an ordering of the binary numeral system such that two successive values differ in only one bit (binary digit). For example, TABLE 1 in FIG. 5B shows an example of a binary code representing a one-to-one mapping between 8 levels (LV 0 to LV 7) and 8 sets of 3-bits data. As shown in TABLE 1 of FIG. 5B, each set of 3-bits data may include three bits of binary values (b1, b2, and b3). In one example, level 1 may correspond to a set of 3-bits data having a value of 000. In another example, level 7 may correspond to another set of 3-bits data having a value of 101.

Also referring to FIG. 5A, in a program operation, a data page having Q sets of the N-bits data can be used to program a select row of memory cells 306 coupled to select word line 318, where Q is a positive integer. In other words, peripheral circuits 302 can be configured to program a select row of memory cells 306 based on a current data page, which has Q sets of the N-bits data. In some implementations, user data is transmitted through data bus 518 to page buffer/sense amplifier 504, and page buffer/sense amplifier 504 is configured to convert the user data into each data page to be programmed into a respective row of memory cells 306 based on a preset gray code. Based on the preset gray code, which defines the mapping of each programmed level and a respective set of N-bits data, control logic 512 is configured to send control signals (e.g., enable signals) to page buffer/sense amplifier 504 to allow page buffer/sense amplifier 504 to generate corresponding data pages for respective program operations. During the program operation, the current data page can be temporarily stored in page buffer/sense amplifier 504, and page buffer/sense amplifier 504 can be configured to provide to each memory cell 306 (coupled to select word line 318) the corresponding set of N-bits data through the corresponding bit line 316. The corresponding set of N-bits data may include N portions of page data (e.g., the set of N-bits data may include N bits from the current data page, with each portion of page data corresponding to a respective bit of the N bits).

For example, for N=3, a select row of memory cells 306 (e.g., a page) may include Q (e.g., Q=3) select memory cells 306 coupled to select word line 318. The current data page may include Q (e.g., Q=3) sets of the 3-bits data including, e.g., 110 (the first set of the 3-bits data), 001 (the second set of the 3-bits data), and 101 (the third set of the 3-bits data). During the ongoing program operation on select row of memory cells 306, level 5 corresponding to 110, level 4 corresponding to 001, and level 7 corresponding to 101 are programmed into the 3 select memory cells 306, respectively. In this example, each of the first, second, or third set of the 3-bits data may include 3 portions of page data, with each portion of page data corresponding to a respective bit from the first, second, or third set of the 3-bits data. For example, the first set of the 3-bits data (e.g., 110) includes a first portion of page data which is "1," a second portion of page data which is "1," and a third portion of page data which is "0."

Consistent with the present disclosure, with respect to a TLC memory device, each set of 3-bits data includes 3 portions of page data (e.g., 3 bits from a current data page). The 3 portions of page data may be denoted as upper page (UP) data, middle page (MP) data, and lower page (LP) data, respectively. With respect to a QLC memory device, each set of 4-bits data includes 4 portions of page data (e.g., 4 bits from the current data page). The 4 portions of page data may be denoted as LP data, MP data, UP data, and extra page (XP) data, respectively.

Figure 6A:
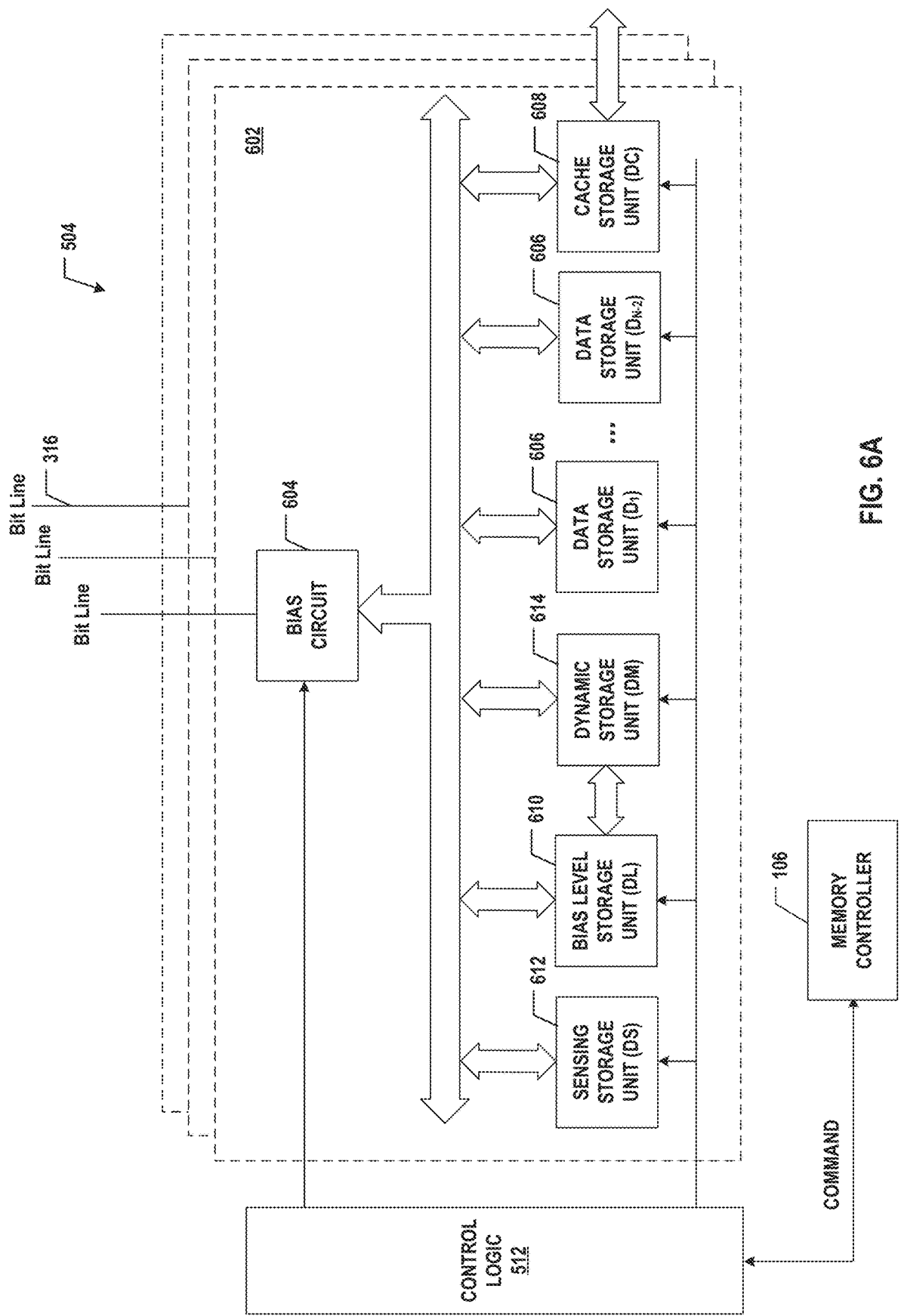
FIG. 6A illustrates a detailed block diagram of an exemplary structure of a page buffer, according to some aspects of the present disclosure.

FIG. 6A illustrates a detailed block diagram of an exemplary structure of a page buffer (e.g., page buffer/sense amplifier 504), according to some aspects of the present disclosure. In some implementations, the page buffer in FIG. 6A includes a plurality of page buffer circuits 602 each coupled to a respective one of bit lines 316. In other words, each page buffer circuit 602 can be coupled to a respective column of memory cells 306 (e.g., NAND memory string 308) through a corresponding bit line 316 and configured to temporarily store a set of N-bits data that is used for programming a respective select memory cell 306 (coupled to select word line 318 and the corresponding bit line 316) in a program operation. All page buffer circuits 602 in the page buffer together can temporarily store the entire current data page (e.g., Q sets of the N-bits data) that are used for programming select row of memory cells 306 (e.g., a page 320 of memory cells 306) coupled to select word line 318 in the program operation. As described above, in some implementations, each page buffer circuit 602 is also configured to pre-process a respective portion of the user data received from data bus 518 and convert it to the corresponding set of N-bits data based on a preset gray code. The corresponding set of N-bits data may include N portions of page data (e.g., N bits from the current data page). For example, for TLCs where N=3, each page buffer circuit 602 may be configured to temporarily store a respective set of the 8 sets of 3 bits of the current data page as shown in TABLE 1 above, where the respective set corresponds to one of 8 levels.

In some implementations, each page buffer circuit 602 can include a plurality of non-dynamic storage units, a dynamic storage unit (DM) 614, and a bias circuit 604. The plurality of non-dynamic storage units may include N-2 data storage units ($D_1, \ldots, D_{N-2}$) 606, a cache storage unit (DC) 608, a bias level storage unit (DL) 610, and a sensing storage unit (DS) 612. Dynamic storage unit (DM) may be coupled to bias level storage unit (DL) 610.

It is understood that each non-dynamic storage unit (such as data storage unit 606, cache storage unit 608, bias level storage unit 610, and sensing storage unit 612) may be any circuit that has two stable states for storing a single bit of data, such as a latch or a flip-flop. In some implementations, each of data storage unit 606, cache storage unit 608, bias level storage unit 610, and sensing storage unit 612 may include a latch. For example, page buffer circuit 602 may have a 4-latch configuration that includes one cache latch, one data latch, one 3-bias-level latch, and one sensing latch for a TLC memory device. In another example, page buffer circuit 602 may have a 5-latch configuration that includes one cache latch, two data latches, one 3-bias-level latch, and one sensing latch for a QLC memory device.

Different from non-dynamic storage units 606, 608, 610, and 612, which can store data permanently (e.g., for an amount of time greater than a predetermined threshold) and do not need to be refreshed regularly, dynamic storage unit 614 may store data for a limited amount of time (e.g., 20 microseconds (µs) or another amount of time less than 40 µs). As a result, dynamic storage unit 614 may need to be refreshed regularly so that the data stored in dynamic storage unit 614 may not be lost. The refreshing of dynamic storage unit 614 is described below in more detail.

During a current program operation for programming a select row of memory cells 306 based on a current data page, each of N-2 data storage units 606 can be configured to store a respective portion of page data from the set of the N-bits data (e.g., a respective bit of the corresponding N bits from the current data page). As a result, N-2 data storage units 606 can store N-2 portions of page data from the set of the N-bits data (e.g., N-2 bits of the corresponding N bits from the current data page).

To reduce the number of non-dynamic storage units and the size of page buffer circuit 602, the number of cache storage unit 608 is limited to one, i.e., a single cache storage unit 608 that can store only a single bit of data at the same time, according to some implementations. Existing multi-cache data loading schemes may require the number of data storage units in each page buffer circuit 602 to be at least the same as the number of bits in the set of N-bits data used for programming the corresponding select memory cell 306, i.e., N data storage units, because the single cache storage unit is dedicated to caching the data of the next data page. Different from the existing schemes and consistent with the scope of the present disclosure, the single cache storage unit 608 in page buffer circuit 602 in FIG. 6A can also be configured to store one of the corresponding N bits from the current data page. That is, cache storage unit 608 is configured to sequentially store one of the corresponding N bits from the current data page and each of the corresponding N bits from the next data page, according to some implementations. In other words, cache storage unit 608 can act as both a data storage unit and a cache storage unit in a time-division manner to replace one of data storage units 606 in each page buffer circuit 602. Additionally, as described below in more detail, dynamic storage unit 614 or bias level storage unit 610 may be configured to store another one of the corresponding N bits from the current data page. Thus, as shown in FIG. 6A, the number of data storage units 606 in each page buffer circuit 602 thus becomes N-2 ($D_1$ to $D_{N-2}$). The total number of data storage units 606 and cache storage unit 608 thus can be reduced from N+1 (in the existing multi-cache data loading schemes) to N-1 (in a data loading scheme disclosed herein), where N-2 data storage units 606 and one cache storage unit 608 are used in the data loading scheme disclosed herein.

In some implementations, another storage unit in each page buffer circuit 602 for storing non-data page information is configured to sequentially store the non-data page information and one of the N bits of the next data page, thereby enabling the caching of all N-1 bits of the next data page in the current program operation to avoid the data loading windows. That is, page buffer circuit 602 can include a multipurpose storage unit that can store the non-data page information and cache the data of the next data page in a time-division manner. For example, sensing storage unit (DS) 612 or bias level storage unit (DL) 610 may be configured to store non-data page information, i.e., any information other than the data bits in a data page.

For example, sensing storage unit (DS) 612 may be configured to store information indicative of whether the current operation performed by page buffer/sense amplifier 504 is a read operation or a program operation. Bias level storage unit (DL) 610 (e.g., a 3-bias-level storage unit) may be configured to store the bias information of the respective bit line 316 coupled to page buffer circuit 602. In some implementations, bias level storage unit 610 may be a multipurpose storage unit that acts as both a bias level storage unit and a data storage unit in a time-division manner. Bias circuit 604 may be coupled to a respective bit line 316 and configured to apply a bit line voltage to corresponding select memory cell 306 coupled to a respective bit line 316 in the program operation. Depending on whether the corresponding select memory cell 306 passes the verification at the respective level according to the N bits of data for programming the select memory cell 306, for example, a high voltage level and a low voltage level, can be used as a bias level to determine a bit line voltage to be applied to the respective bit line 316 in a next program operation. In some implementations, to optimize the threshold voltage distributions, for example, enlarging the read margins between adjacent levels and reducing the width of each level, a medium voltage level is also used as the bias level to determine the bit line voltage in the next program operation. That is, one of three voltage levels, e.g., high, medium, and low (referred to herein as 3-bias-level), can be used as the bias level to determine the bit line voltage applied to the respective bit line 316 in the next program operation. In some implementations, the bias level is non-data page information stored in bias level storage unit 610.

It is understood that although bias level storage unit 610 is described herein as an example of the multipurpose storage unit, any suitable non-data page storage units in page buffer circuit 602, such as sensing storage unit 612, or any other non-data page storage units not shown in FIG. 6A, may be used as the multipurpose storage unit in some examples without adding additional storage units into page buffer circuit 602.

Consistent with some aspects of the present disclosure, a first set of information and a second set of information can be initially stored in dynamic storage unit 614 and a first non-dynamic storage unit, respectively. Alternatively, the first set of information and the second set of information can be initially stored in the first non-dynamic storage unit and dynamic storage unit 614, respectively. The first non-dynamic storage unit can be any one of the plurality of non-dynamic storage units disclosed herein, including, for example, data storage units ($D_1, \ldots, D_{N-2}$) 606, cache storage unit (DC) 608, bias level storage unit (DL) 610, and sensing storage unit (DS) 612. For example, the first non-dynamic storage unit can be bias level storage unit 610. The first set of information can be bias level information describing a bias level (e.g., a high, medium, or low bias level). The second set of information can be a portion of page data (e.g., LP data, MP data, UP data, XP data, etc.).

A third set of information can be stored in a second non-dynamic storage unit form the plurality of non-dynamic storage units. The second non-dynamic storage unit is different from the first non-dynamic storage unit, and can also be any one of data storage units ($D_1, \ldots, D_{N-2}$) 606, cache storage unit (DC) 608, bias level storage unit (DL) 610, and sensing storage unit (DS) 612. The second non-dynamic storage unit can be sensing storage unit (DS) 612, and the third set of information can be inhibit information stored in sensing storage unit 612. The inhibit information may include any non-data page information associated with a program operation. For example, the inhibit information may indicate whether a program verification on memory cell 306 has passed or not.

Consistent with some aspects of the present disclosure, control logic 512 may be configured to determine a type of an operation to be performed on page buffer circuit 602. In some implementations, the type of the operation may include at least one of updating the first set of information, reading out the first set of information, updating the second set of information, or reading out the second set of information. In some other implementations, the type of the operation may include updating the third set of information stored in the second non-dynamic storage unit.

Control logic 512 may also be configured to determine an information storage manner between dynamic storage unit 614 and the first non-dynamic storage unit. The information storage manner may indicate that: the first set of information is stored in dynamic storage unit 614; and the second set of information is stored in the first non-dynamic storage unit. Alternatively, the information storage manner may indicate that: the first set of information is stored in the first non-dynamic storage unit; and the second set of information is stored in dynamic storage unit 614.

Control logic 512 may be further configured to determine whether an information swapping process is performed between dynamic storage unit 614 and the first non-dynamic storage unit based on (a) the type of the operation to be performed on page buffer circuit 602 and (b) the information storage manner between dynamic storage unit 614 and the first non-dynamic storage unit. Then, control logic 512 may be configured to perform the operation on page buffer circuit 602 based on the determining whether the information swapping process is performed.

With respect to the information swapping process, control logic 512 may be configured to perform the information swapping process by swapping the first and second sets of information between dynamic storage unit 614 and the first non-dynamic storage unit. For example, the swapping of the first and second sets of information between dynamic storage unit 614 and the first non-dynamic storage unit can be triggered by a logic signal generated by control logic 512. For example, page buffer circuit 602 may further include a sensing node (e.g., an SO node shown in FIG. 7A). Dynamic storage unit 614 and the plurality of non-dynamic storage units can be coupled to the sensing node. Without loss of generality, assuming that the first set of information is initially stored in dynamic storage unit 614, and the second set of information is initially stored in the first non-dynamic storage unit. To swap the first and second sets of information, control logic 512 may be configured to: (a) configure page buffer circuit 602 to modify a potential of the sensing node based on the first set of information in dynamic storage unit 614; (b) re-store the second set of information in the first non-dynamic storage unit into dynamic storage unit 614; and (c) configure page buffer circuit 602 to re-store the first set of information into the first non-dynamic storage unit based on the potential of the sensing node. In this case, the first set of information stored in dynamic storage unit 614 is then changed to be stored in the first non-dynamic storage unit, and the second set of information stored in the first non-dynamic storage unit is then changed to be stored in dynamic storage unit 614.

In a next round of swapping the first and second sets of information, control logic 512 may be further configured to: (a) configure page buffer circuit 602 to modify a potential of the sensing node based on the second set of information in dynamic storage unit 614; (b) re-store the first set of information in the first non-dynamic storage unit into dynamic storage unit 614; and (c) configure page buffer circuit 602 to re-store the second set of information into the first non-dynamic storage unit based on the potential of the sensing node. In this case, the first set of information stored in the first non-dynamic storage unit is then changed to be stored in dynamic storage unit 614 again, and the second set of information stored in dynamic storage unit 614 is then changed to be stored in the first non-dynamic storage unit again.

In some implementations, control logic 512 may be configured to refresh dynamic storage unit 614 by performing the information swapping process in a predetermined time interval, so that dynamic storage unit 614 can be refreshed in the predetermined time interval. The information swapping process is further described below in more detail with reference to FIG. 7B.

Consistent with some aspects of the present disclosure, the first non-dynamic storage unit (such as bias level storage unit 610) can be set or reset, whereas dynamic storage unit 614 can be used for temporary data storage, data read out, or charging of the sensing node. For example, information stored in the first non-dynamic storage unit can be modified or updated, whereas information stored in dynamic storage unit 614 can be read out (e.g., not being modified). Thus, information stored in dynamic storage unit 614 can be updated or modified by: (a) re-storing the information from dynamic storage unit 614 to the first non-dynamic storage unit through the information swapping process; and (b) updating the information in the first non-dynamic storage unit. Information stored in the first non-dynamic storage unit can be read out by: (a) re-storing the information from the first non-dynamic storage unit to dynamic storage unit 614 through the information swapping process; and (b) reading out the information through dynamic storage unit 614.

In some implementations, the type of the operation to be performed on page buffer circuit 602 may include updating the first set of information. To determine whether the information swapping process is performed, control logic 512 may be further configured to determine whether the first set of information is stored in dynamic storage unit 614 or the first non-dynamic storage unit based on the information storage manner. Responsive to the first set of information being stored in the first non-dynamic storage unit, control logic 512 may determine not to perform the information swapping process between dynamic storage unit 614 and the first non-dynamic storage unit. Alternatively, responsive to the first set of information being stored in dynamic storage unit 614, control logic 512 may determine to perform the information swapping process between dynamic storage unit 614 and the first non-dynamic storage unit.

Subsequently, to perform the operation on the page buffer circuit, control logic 512 may be further configured to, responsive to determining not to perform the information swapping process when the first set of information is stored in the first non-dynamic storage unit, update the first set of information on the first non-dynamic storage unit. Alternatively, responsive to determining to perform the information swapping process when the first set of information is stored in dynamic storage unit 614, control logic 512 may be configured to perform the information swapping process to re-store the first set of information from dynamic storage unit 614 to the first non-dynamic storage unit, and update the first set of information on the first non-dynamic storage unit. An exemplary process to update the first set of information (e.g., the bias level information) is illustrated below with reference to FIG. 8B.

In some implementations, the type of the operation to be performed on page buffer circuit 602 may include reading out the first set of information. To determine whether the information swapping process is performed, control logic 512 may be further configured to determine whether the first set of information is stored in the dynamic storage unit or the first non-dynamic storage unit. Responsive to the first set of information being stored in the first non-dynamic storage unit, control logic 512 may determine to perform the information swapping process between dynamic storage unit 614 and the first non-dynamic storage unit. Alternatively, responsive to the first set of information being stored in dynamic storage unit 614, control logic 512 may determine not to perform the information swapping process between dynamic storage unit 614 and the first non-dynamic storage unit.

Subsequently, to perform the operation on page buffer circuit 602, control logic 512 may be further configured to, responsive to determining to perform the information swapping process when the first set of information is stored in the first non-dynamic storage unit, perform the information swapping process to re-store the first set of information from the first non-dynamic storage unit to dynamic storage unit 614, and read out the first set of information from dynamic storage unit 614. Alternatively, responsive to determining not to perform the information swapping process when the first set of information is stored in dynamic storage unit 614, control logic 512 is configured to read out the first set of information from dynamic storage unit 614. An exemplary process to read out the first set of information (e.g., the bias level information) is illustrated below with reference to FIG. 8B.

In some implementations, the type of the operation to be performed on page buffer circuit 602 may include updating the third set of information stored in the second non-dynamic storage unit. To determine whether the information swapping process is performed, control logic 512 may be further configured determine whether the second set of information is stored in dynamic storage unit 614 or the first non-dynamic storage unit based on the information storage manner. Responsive to the second set of information being stored in the first non-dynamic storage unit, control logic 512 may determine not to perform the information swapping process between dynamic storage unit 614 and the first non-dynamic storage unit. Alternatively, responsive to the second set of information being stored in dynamic storage unit 614, control logic 512 may determine to perform the information swapping process between dynamic storage unit 614 and the first non-dynamic storage unit.

Subsequently, to perform the operation on page buffer circuit 602, the control logic is further configured to, responsive to determining not to perform the information swapping process when the second set of information is stored in the first non-dynamic storage unit, update the second set of information on the first non-dynamic storage unit. Control logic 512 may update the third set of information on the second non-dynamic storage unit based on the updated second set of information. Alternatively, responsive to determining to perform the information swapping process when the second set of information is stored in the dynamic storage unit, control logic 512 may perform the information swapping process to re-store the second set of information from dynamic storage unit 614 to the first non-dynamic storage unit, update the second set of information on the first non-dynamic storage unit, and update the third set of information on the second non-dynamic storage unit based on the updated second set of information. An exemplary process to update the third set of information (e.g., inhibit information) based on the second set of information (e.g., LP data) is illustrated below with reference to FIG. 8B.

Figure 6B:
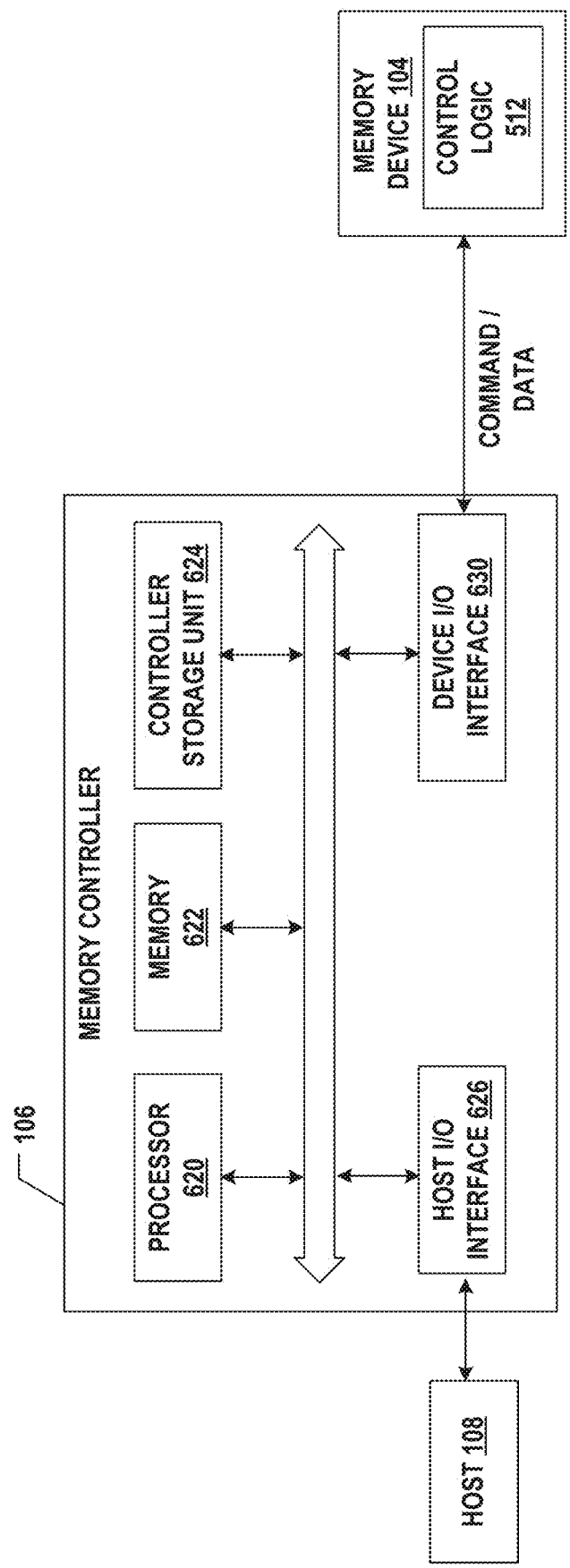
FIG. 6B illustrates a detailed block diagram of an exemplary structure of a memory controller, according to some aspects of the present disclosure.

FIG. 6B illustrates a detailed block diagram of an exemplary structure of a memory controller (e.g., memory controller 106), according to some aspects of the present disclosure. Memory controller 106 may include at least one of a processor 620, a memory 622, a controller storage unit 624, a host input/output (I/O) interface 626, or a device I/O interface 630.

Processor 620 can be any suitable type of processors, for example, a central processing unit (CPU), a microprocessor, a system-on-chip (SoC), or an application processor (AP), etc. Processor 620 may include various computing architectures including a complex instruction set computer (CISC) architecture, a reduced instruction set computer (RISC) architecture, or an architecture implementing a combination of instruction sets. Although only a single processor is shown in FIG. 6B, multiple processors may be included. Processor 620 can be configured to send or receive data to or from memory 622. For example, processor 620 can be configured to receive instructions from memory 622 and execute the instructions to provide the functionality described herein.

Memory 622 stores data that may include code or routines for performing part of or all of the techniques described herein. Memory 622 may be a dynamic random access memory (DRAM) device, a static random access memory (SRAM) device, a hard disk drive, a floppy disk drive, a CD-ROM device, a DVD-ROM device, a DVD-RAM device, a DVD-RW device, a flash memory device (e.g., NAND Flash memory device), or some other suitable memory device.

Controller storage unit 624 can be any suitable storage unit included in memory controller 106. For example, controller storage unit 624 may be a cache storage unit or a data storage unit. In another example, controller storage unit 624 may be a latch or a flip-flop. In some implementations, controller storage unit 624 may be configured to store program information associated with a program operation. Alternatively, the program information may be stored in memory 622. Although a single controller storage unit is shown in FIG. 6B, it is understood that memory controller 106 may include a plurality of controller storage units.

Host I/O interface 626 may be an interface that couples memory controller 106 to host 108. For example, host I/O interface 626 may include one or more of a network interface, a universal serial bus (USB), a thunderbolt, or any other suitable type of interface capable of outputting or receiving data to or from host 108. Similarly, device I/O interface 630 may be an interface that couples memory controller 106 to memory device 104. For example, device I/O interface 630 may include any suitable type of interface capable of outputting or receiving data to or from memory device 104.

In some implementations, a command (e.g., a program command, a read command, etc.) received from host 108 can be sent to control logic 512 of memory device 104 through device I/O interface 630. In some implementations, data received from memory device 104 can be sent to host 108 through device I/O interface 630 and host I/O interface 626.

Figure 7A:
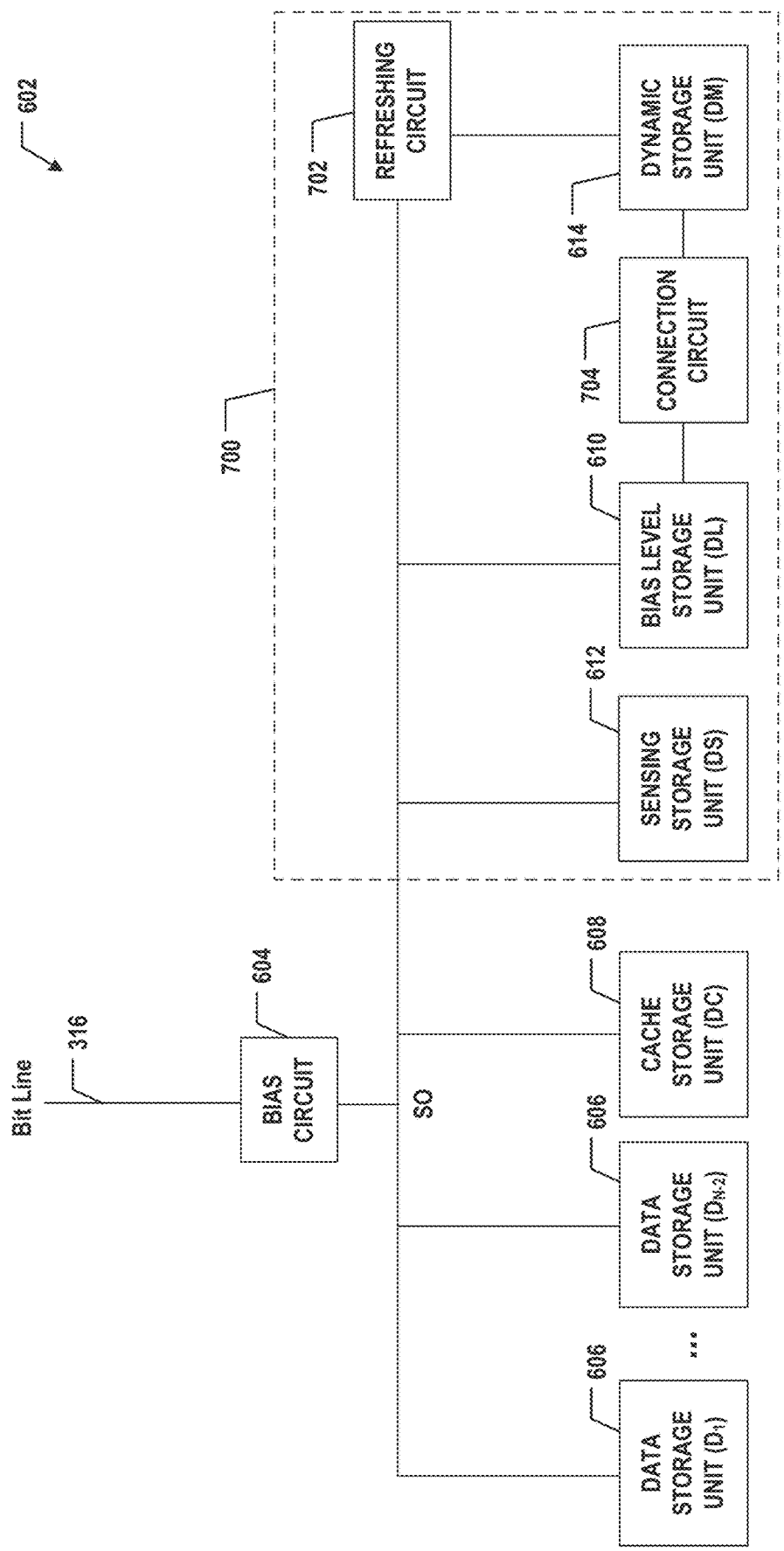
FIG. 7A illustrates a detailed block diagram of an exemplary structure of a page buffer circuit in the page buffer of FIG. 6A, according to some aspects of the present disclosure.

FIG. 7A illustrates a detailed block diagram of an exemplary structure of a page buffer circuit (e.g., page buffer circuit 602), according to some aspects of the present disclosure. In FIG. 7A, an output of bias circuit 604 is coupled to the sensing node (e.g., the SO node). N-2 data storage units 606, cache storage unit 608, sensing storage unit 612, and bias level storage unit 610 are coupled to the SO node, respectively. Page buffer circuit 602 of FIG. 7A further includes a refreshing circuit 702 configured to refresh dynamic storage unit 614 under the control of control logic 512. Bias level storage unit 610 is coupled to dynamic storage unit 614 via a connection circuit 704. A portion 700 of page buffer circuit 602 in FIG. 7A (including sensing storage unit 612, bias level storage unit 610, connection circuit 704, dynamic storage unit 614, and refreshing circuit 702) is illustrated below in more detail with reference to FIG. 7B.

Figure 7B:
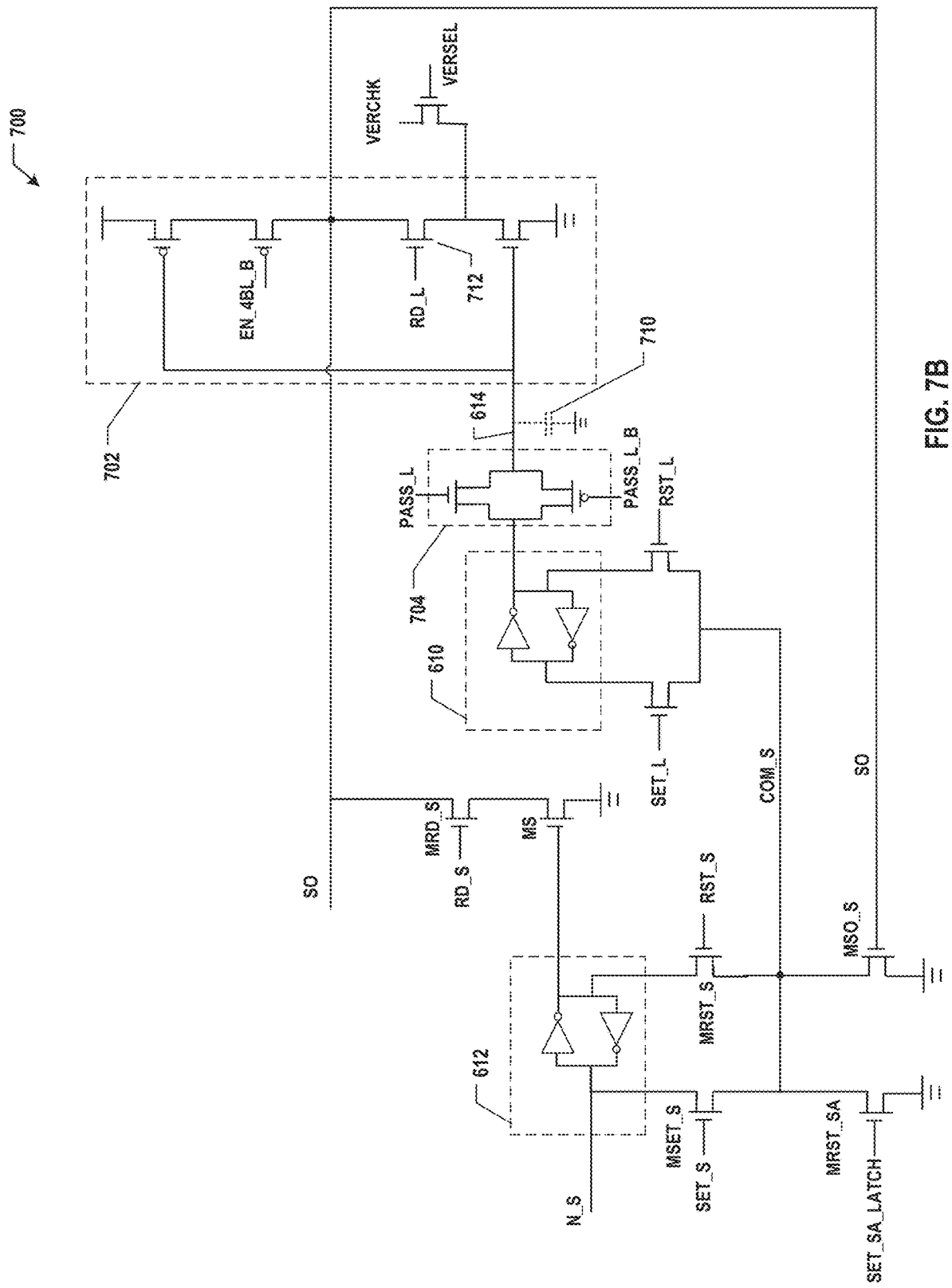
FIG. 7B illustrates a circuit diagram of a portion of the page buffer circuit in FIG. 7A, according to some aspects of the present disclosure.

FIG. 7B illustrates a circuit diagram of a portion (e.g., portion 700) of page buffer circuit 602 in FIG. 7A, according to some aspects of the present disclosure. Exemplary circuit structures of sensing storage unit 612, bias level storage unit 610, connection circuit 704, dynamic storage unit 614, and refreshing circuit 702 are illustrated in FIG. 7B. Bias level storage unit 610 and dynamic storage unit 614 are coupled to each other through connection circuit 704. Connection circuit 704 may include a first transistor controlled by a signal PASS_L and a second transistor controlled by a signal PASS_L_B, where the first and second transistors are connected in parallel. Dynamic storage unit 614 may include a connection line that connects connection circuit 704 to refreshing circuit 702. A voltage level (or, a current level, a potential level) of the connection line can be modified based on the first or second set of information stored in dynamic storage unit 614. Dynamic storage unit 614 may store the first or second set of information temporarily by utilizing its parasitic capacitance (e.g., illustrated as a capacitor 710 in FIG. 7B) for a limited amount of time such as 20 µs or another amount of time less than 40 µs.

By taking bias level storage unit 610 as an example for the first non-dynamic storage unit used in the information swapping process, dynamic storage unit 614 and bias level storage unit 610 may store the first and second sets of information, respectively. To control dynamic storage unit 614 and bias level storage unit 610 to swap the first and second sets of information, control logic 512 may perform the information-swapping process through the SO node. For example, the information-swapping process may include at least one of the following operations: (1) toggling signals RD_L and EN_4BL_B that are applied to refreshing circuit 702, so that the potential level of the SO node can be modified based on the first set of information stored in dynamic storage unit (DM) 614 (e.g., SO=-DM); (2) toggling the signal PASS_L so that connection circuit 704 is turned on and the second set of information stored in bias level storage unit (DL) 610 is re-stored into dynamic storage unit (DM) 614 (e.g., DM=DL); (3) setting signals SET_L and RST_SA_LATCH so that bias level storage unit (DL) 610 is configured to have a value of "1" (e.g., DL="1"); or (4) setting a signal RST_L so that the first set of information is re-stored into bias level storage unit (DL) 610 based on the potential level of the SO node (e.g., DL=-SO). As a result, the first set of information stored in bias level storage unit (DL) 610 previously is re-stored into dynamic storage unit (DM) 614, and the second set of information stored in dynamic storage unit (DM) 614 previously is re-stored into bias level storage unit (DL) 610. This information-swapping process may take, for example, about 400 nanoseconds (ns). Each time when the first and second sets of information are swapped between dynamic storage unit (DM) 614 and bias level storage unit (DL) 610, dynamic storage unit (DM) 614 can be refreshed once. As a result, even though dynamic storage unit (DM) 614 can only store data for a limited amount of time, dynamic storage unit (DM) 614 can be used to store the first or second set of information due to the information-swapping process.

FIG. 8A is a graphical representation illustrating exemplary information stored in an example page buffer circuit with respect to a TLC memory device (shown in Table 2) or a QLC memory device (shown in Table 3) according to some examples. In Table 2, a program operation is configured to program a set of 3-bits data at one of 8 levels to a memory cell, where the set of 3-bits data includes 3 portions of page data (e.g., LP data, MP data, and UP data). By way of examples, inhibit information associated with the program operation is stored in sensing storage unit 612, and bias level information (e.g., 3-bias-level information) is stored in bias level storage unit 610. The LP data, the MP data, and the UP data are stored in data storage unit ($D_1$) 606, data storage unit ($D_2$) 606, and cache storage unit 608, respectively. It is noted that two data storage units, as well as one data cache storage unit, are needed for the storage of the 3 portions of page data in Table 2.

In Table 3, a program operation is configured to program a set of 4-bits data at one of 16 levels to a memory cell, where the set of 4-bits data includes 4 portions of page data (e.g., LP data, MP data, UP data, and XP data). By way of examples, inhibit information associated with the program operation is stored in sensing storage unit 612, and bias level information is stored in bias level storage unit 610. The LP data, the MP data, the UP data, and the XP data are stored in data storage unit ($D_1$) 606, data storage unit ($D_2$) 606, data storage unit ($D_3$) 606, and cache storage unit 608, respectively. It is noted that three data storage units as well as one data cache storage unit are needed for the storage of the 4 portions of page data in Table 3.

FIG. 8B is a graphical representation illustrating exemplary information stored in a page buffer circuit disclosed herein (e.g., page buffer circuit 602 of FIG. 6A, 7A or 7B) with respect to a TLC memory device (shown in Table 4) or a QLC memory device (shown in Table 5), according to some aspects of the present disclosure. Like Table 2, Table 4 illustrates that a program operation is configured to program a set of 3-bits data at one of 8 levels to a memory cell, where the set of 3-bits data includes 3 portions of page data. By way of examples, inhibit information is stored in sensing storage unit 612. Bias level information (e.g., 3-bias-level information) is stored in bias level storage unit 610, and LP data is stored in dynamic storage unit 614; or, the bias level information is stored in dynamic storage unit 614, and the LP data is stored in bias level storage unit 610. MP data and UP data are stored in data storage unit ($D_1$) 606 and cache storage unit 608, respectively. An information swapping process may be performed to swap the bias level information and the LP data between bias level storage unit 610 and dynamic storage unit 614 periodically so that dynamic storage unit 614 can be refreshed periodically.

Compared with Table 2 where two data storage units are needed for storing the portions of page data, in Table 4 only one data storage unit is needed for storing the portions of page data with respect to the TLC memory device. Thus, the total number of data storage units in the page buffer circuit disclosed herein with respect to the TLC memory device is reduced by one when compared with the example shown in Table 2 of FIG. 8A. The chip area of the page buffer circuit disclosed herein can therefore be reduced.

Like Table 3, Table 5 illustrates that a program operation is configured to program a set of 4-bits data at one of 16 levels to a memory cell, where the set of 4-bits data includes 4 portions of page data. By way of examples, inhibit information is stored in sensing storage unit 612. Bias level information is stored in bias level storage unit 610, and LP data is stored in dynamic storage unit 614; or, the bias level information is stored in dynamic storage unit 614, and LP data is stored in bias level storage unit 610. MP data, UP data, and LP data are stored in data storage unit ($D_1$) 606, data storage unit ($D_2$) 606, and cache storage unit 608, respectively. An information swapping process may be performed to swap the bias level information and the LP data between bias level storage unit 610 and dynamic storage unit 614 periodically so that dynamic storage unit 614 can be refreshed periodically.

Compared with Table 3 where three data storage units are needed for storing the portions of page data, in Table 5 only two data storage units are needed for storing the portions of page data with respect to the QLC memory device. Thus, the total number of data storage units in the page buffer circuit disclosed herein with respect to the QLC memory device is reduced by one when compared with the example shown in Table 3 of FIG. 8A. The chip area of the page buffer circuit disclosed herein can therefore be reduced.

In some implementations, it can be determined in the page buffer circuit disclosed herein whether an information swapping process is performed between dynamic storage unit 614 and the first non-dynamic storage unit (e.g., bias level storage unit 610) based on a type of an operation to be performed on the page buffer circuit and an information storage manner between dynamic storage unit 614 and the first non-dynamic storage unit. The operation may be performed on the page buffer circuit based on the determining whether the information swapping process is performed.

An exemplary process to update the bias level information (which is an example of the first set of information) is provided herein. It is contemplated that the bias level information can be updated when it is stored in bias level storage unit 610, since information stored in bias level storage unit 610 can be reset or modified directly whereas information stored in dynamic storage unit 614 cannot be reset or modified directly. Initially, control logic 512 may control determine whether the bias level information is stored in dynamic storage unit 614 or bias level storage unit 610 based on the information storage manner between dynamic storage unit 614 and bias level storage unit 610. Responsive to the bias level information being stored in bias level storage unit 610, control logic 512 may update the bias level information in bias level storage unit 610 directly. Or, responsive to the bias level information being stored in dynamic storage unit 614, control logic 512 may (a) perform the information swapping process to re-store the bias level information from dynamic storage unit 614 into bias level storage unit 610, and (b) update the bias level information in bias level storage unit 610.

Alternatively or additionally, the bias level information may be read out through dynamic storage unit 614. An exemplary process to read out the bias level information is provided herein. Specifically, control logic 512 may initially determine whether the bias level information is stored in bias level storage unit 610 or dynamic storage unit 614 based on the information storage manner between dynamic storage unit 614 and bias level storage unit 610. Responsive to the bias level information being stored in dynamic storage unit 614, control logic 512 may read out the bias level information through dynamic storage unit 614 directly. For example, with reference to FIG. 7B, the signal RD_L may be configured to turn on a transistor 712, so that the potential of the SO node can be modified based on the bias level information stored in dynamic storage unit 614. Then, the bias level information can be read out based on the potential level of the SO node. Or, responsive to the bias level information being stored in bias level storage unit 610, control logic 512 may (a) perform the information swapping process to re-store the bias level information from bias level storage unit 610 into dynamic storage unit 614, and (b) read out the bias level information through dynamic storage unit 614 directly.

An exemplary process to update the LP data (which is an example of the second set of information) is also provided herein. Initially, control logic 512 may determine whether the LP data is stored in dynamic storage unit 614 or bias level storage unit 610 based on the information storage manner between dynamic storage unit 614 and bias level storage unit 610. Responsive to the LP data being stored in bias level storage unit 610, control logic 512 may update the LP data in bias level storage unit 610 directly. Alternatively, responsive to the LP data being stored in dynamic storage unit 614, control logic 512 may (a) perform the information swapping process to re-store the LP data from dynamic storage unit 614 into bias level storage unit 610, and (b) update the LP data in bias level storage unit 610 directly.

Alternatively or additionally, the LP data may be read out through dynamic storage unit 614. An exemplary process to read out the LP data is provided herein. Specifically, control logic 512 may initially determine whether the LP data is stored in bias level storage unit 610 or dynamic storage unit 614 based on the information storage manner between dynamic storage unit 614 and bias level storage unit 610. Responsive to the LP data being stored in dynamic storage unit 614, control logic 512 may read out the LP data through dynamic storage unit 614 directly. Alternatively, responsive to the LP data being stored in bias level storage unit 610, control logic 512 may (a) perform the information swapping process to res-store the LP data from bias level storage unit 610 into dynamic storage unit 614, and (b) read out the LP data through dynamic storage unit 614 directly.

In some implementations, each of the LP data, the MP data, the UP data, and/or the XP data may be set to "1" (e.g., being set to an erased state) so that a level of a programmed state can be modified. The inhibit information can be updated after setting each of the LP data, the MP data, the UP data, and/or the XP data to "1." An exemplary process to update the inhibit information based on the LP data is provided herein.

Initially, control logic 512 may determine whether the LP data is stored in dynamic storage unit 614 or bias level storage unit 610. Responsive to the LP data being stored in bias level storage unit 610, control logic 512 may (a) update the LP data in bias level storage unit 610 (e.g., setting the LP data to "1"), and update the MP data, the UP data, and/or the XP data as well (e.g., setting each of the MP data, the UP data, and/or the XP data to "1"), and (b) update the inhibit information based on the updated LP data as well as the updated MP data, the updated UP data, and/or the updated XP data. Alternatively, responsive to the LP data being stored in dynamic storage unit 614, control logic 512 may (a) perform the information swapping process to re-store the LP data from dynamic storage unit 614 into bias level storage unit 610, (b) update the LP data in bias level storage unit 610, and update the MP data, the UP data, and/or the XP data as well, and (c) update the inhibit information based on the updated LP data as well as the updated MP data, the updated UP data, and/or the updated XP data.

Referring to FIG. 8C, exemplary information stored in a page buffer circuit disclosed herein (e.g., page buffer circuit 602 of FIG. 6A, 7A or 7B) with respect to an MLC memory device (e.g., N=2) is shown in Table 6, according to some aspects of the present disclosure. Table 6 illustrates that a program operation is configured to program a set of 2-bits data to a memory cell, where the set of 2-bits data includes 2 portions of page data (e.g., LP data, MP data). By way of examples, inhibit information is stored in sensing storage unit 612. Bias level information is stored in bias level storage unit 610, and the LP data is stored in dynamic storage unit 614; or, the bias level information is stored in dynamic storage unit 614, and the LP data is stored in bias level storage unit 610. The MP data is stored in cache storage unit 608. An information swapping process may be performed to swap the bias level information and the LP data between bias level storage unit 610 and dynamic storage unit 614 periodically so that dynamic storage unit 614 can be refreshed periodically. It is noted that there is no need to include any data storage unit in the page buffer circuit for the storage of the LP data and the MP data with respect to the MLC memory device. Thus, the chip area of the page buffer circuit disclosed herein can therefore be reduced.

Figure 9:
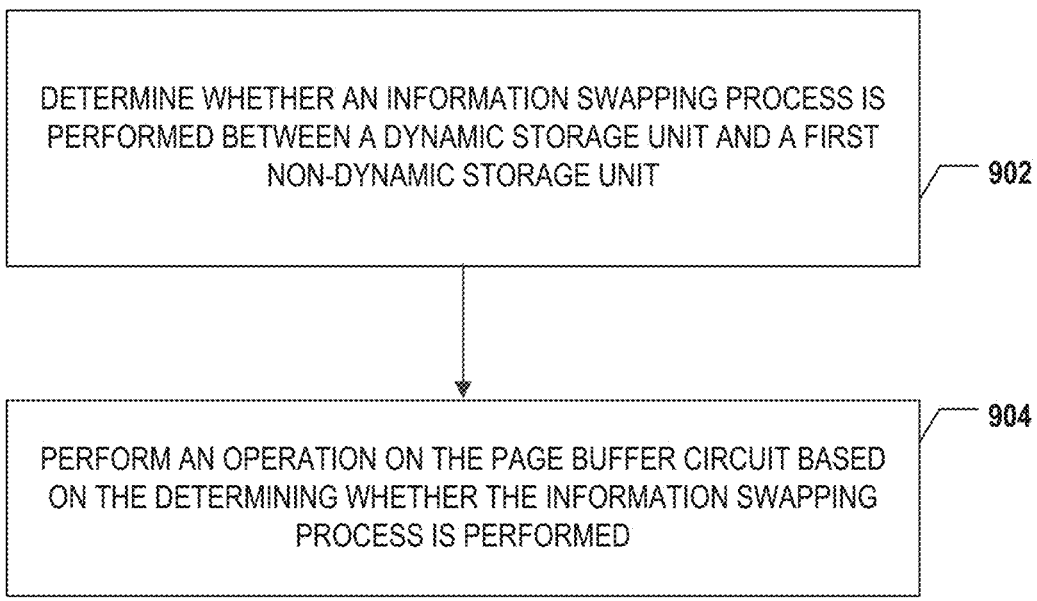
FIG. 9 illustrates a flowchart of an exemplary method for operating a memory device, according to some aspects of the present disclosure.

FIG. 9 illustrates a flowchart of an exemplary method 900 for operating a memory device, according to some aspects of the present disclosure. The memory device may be any suitable memory device disclosed herein, such as memory device 300. Method 900 may be implemented by peripheral circuits 302, such as control logic 512. It is understood that the operations shown in method 900 may not be exhaustive and that other operations can be performed as well before, after, or between any of the illustrated operations. Further, some of the operations may be performed simultaneously, or in a different order than shown in FIG. 9.

Referring to FIG. 9, method 900 starts at operation 902, in which it is determined whether an information swapping process is performed between a dynamic storage unit of a page buffer circuit of the memory device and a first non-dynamic storage unit of the page buffer circuit based on a type of an operation to be performed on a page buffer circuit and an information storage manner between the dynamic storage unit and the first non-dynamic storage unit.

Method 900 proceeds to operation 904, as illustrated in FIG. 9, in which the operation is performed on the page buffer circuit based on the determining whether the information swapping process is performed.

Figure 10A:
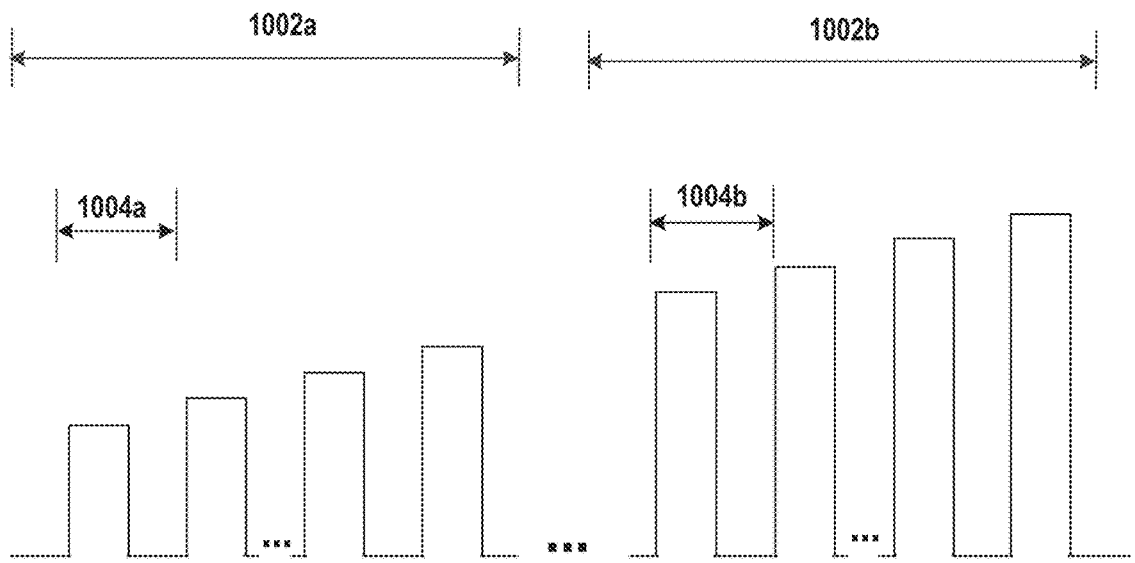
FIGS. 10A-10B are graphical representations illustrating a waveform of word line voltages applied to a selected word line in a multi-pass program operation, according to some aspects of the present disclosure.
Figure 10B:
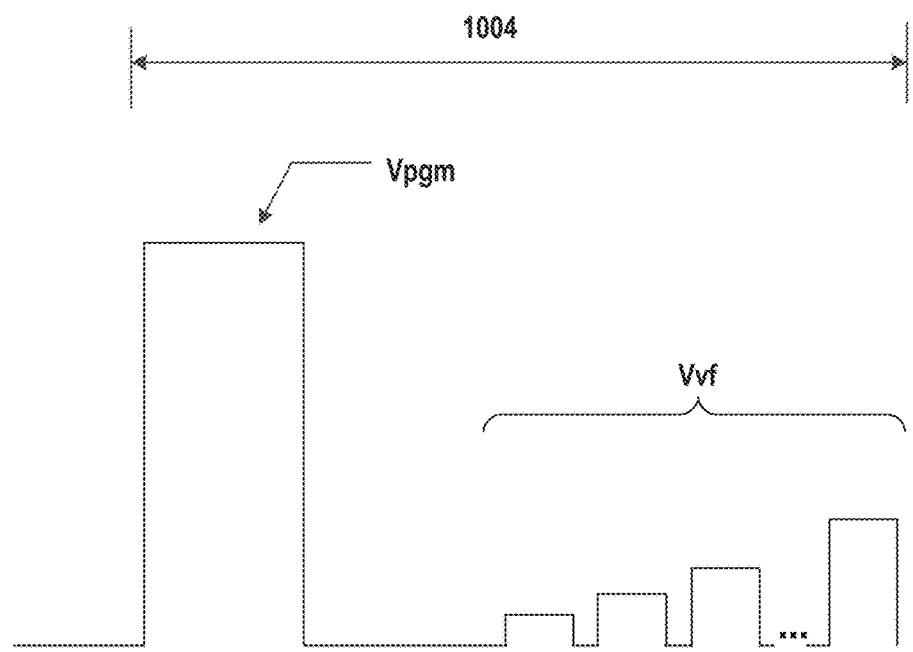

FIGS. 10A-10B are graphical representations illustrating a waveform of word line voltages applied to a selected word line in a multi-pass program operation, according to some aspects of the present disclosure. To perform a program operation, in addition to page buffer/sense amplifier 504 providing to each target memory cell 306 a corresponding set of N-bits data, row decoder/word line driver 508 can be configured to apply program voltages and verify voltages to a selected word line 318 coupled to a row of target memory cells 306 in one or more program/verify loops in order to raise the threshold voltage of each target memory cell 306 to a desired level (into a desired range of threshold voltages) based on the corresponding set of the N-bits data. As shown in FIG. 10A, the multi-pass program operation includes at least a first pass 1002a (a.k.a., a coarse program pass, e.g., a non-last program pass) and a second pass 1002b (a.k.a., a fine program pass, e.g., the last program pass) after first pass 1002a. First pass 1002a includes one or more program/verify loops 1004a, and second pass 1002b includes one or more program/verify loops 1004b as well.

As shown in FIG. 10B, in each program/verify loop 1004, regardless of whether it is in first pass 1002a or second pass 1002b, a program voltage (Vpgm) is applied to the selected word line, followed by a number of verify voltages (Vvf) with incremental changes of voltage levels. Taking TLCs as an example, where N=3, the target memory cells are first programmed into one of 8 intermediate levels (LV0, LV1, . . . , LV7) in first pass 1002a by applying 7 verify voltages each between two adjacent intermediate levels based on all the 3 portions of page data. In second pass 1002b, by applying a larger program voltage, the threshold voltages of target memory cells in each level (e.g., in the programmed state) are shifted up to a respective final level (LV0, LV1, ..., LV7) with reduced width of the threshold voltage distribution (i.e., a narrower range) based on all the 3 portions of page data. The numbers of verify voltages (and corresponding verify processes) in each program/verify loop 1004 in each of first and second passes 1002*a* and 1002*b* are the same, i.e., 7.

Figure 11:
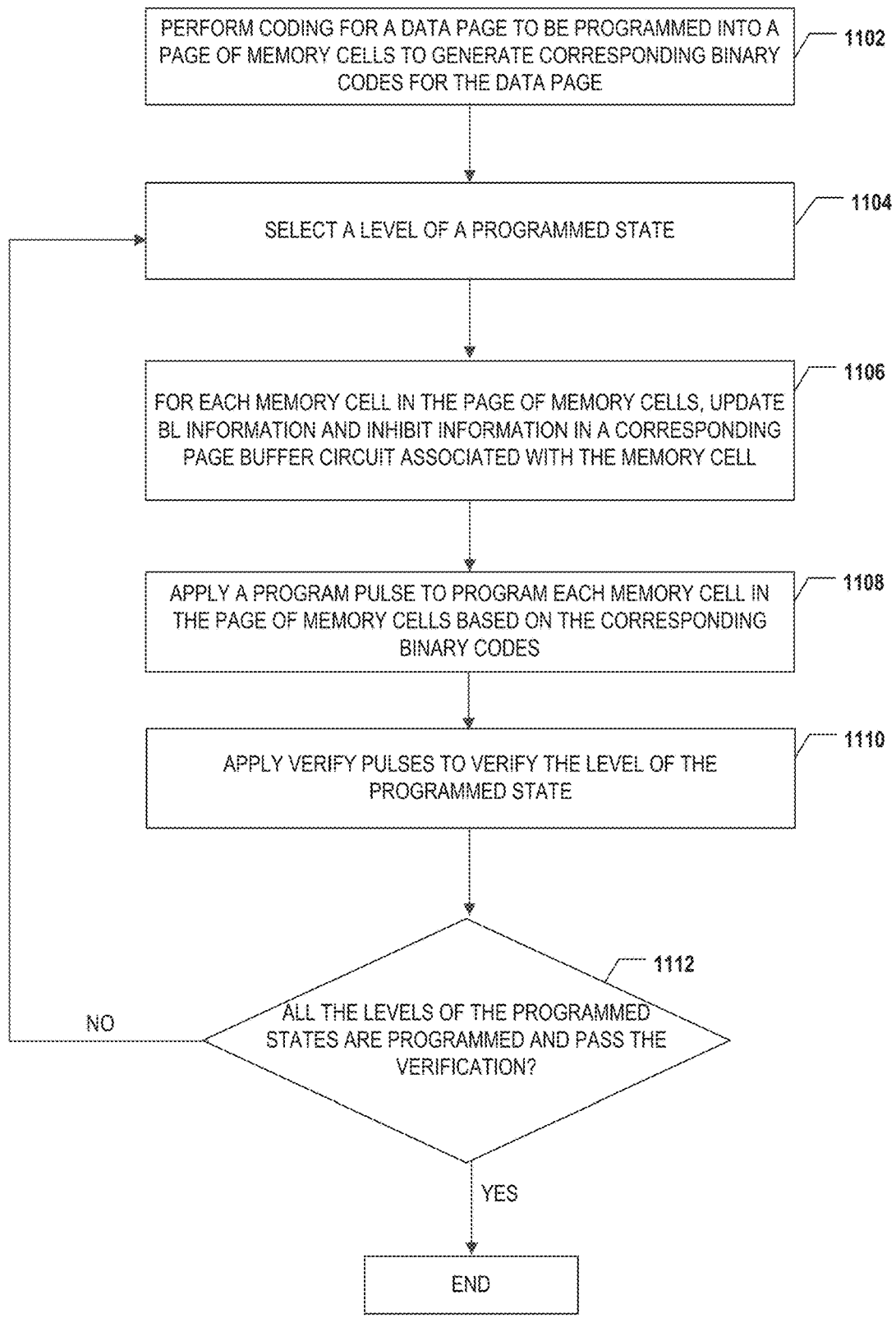
FIG. 11 illustrates a flowchart of an exemplary method for performing a program operation in a memory device, according to some aspects of the present disclosure.

FIG. 11 illustrates a flowchart of an exemplary method 1100 for performing a program operation in a memory device, according to some aspects of the present disclosure. The memory device may be any suitable memory device disclosed herein, such as memory device 300. Method 1100 may be implemented by peripheral circuits 302, such as control logic 512. It is understood that the operations shown in method 1100 may not be exhaustive and that other operations can be performed as well before, after, or between any of the illustrated operations. Further, some of the operations may be performed simultaneously, or in a different order than shown in FIG. 11.

Referring to FIG. 11, method 1100 starts at operation 1102, in which coding is performed for a data page which is to be programmed into a page of memory cells so that corresponding binary codes (e.g., Gray codes) are generated for the data page.

For each program/verify loop of the program operation (e.g., program/verify loop 1004 in FIG. 10B), operations 1104-1112 may be performed to apply a program voltage (Vpgm) to a selected word line, followed by a number of verify voltages (Vvf) with incremental changes of voltage levels.

At operation 1104 as illustrated in FIG. 11, a level of a programmed state (e.g., a program voltage (Vpgm)) is selected and applied for the selected word line.

At operation 1106 as illustrated in FIG. 11, for each memory cell in the page of memory cells, bias level information and inhibit information are updated by a corresponding page buffer circuit associated with the memory cell. For example, each of the bias level information and the inhibit information can be updated based on a determination whether an information swapping process is performed as described above.

At operation 1108 as illustrated in FIG. 11, a program pulse is applied to program each memory cell in the page of memory cells based on the corresponding binary codes of the data page. For example, each of the bias level information and the inhibit information can be read out based on a determination whether the information swapping process is performed as described above for the programming of the corresponding memory cell.

At operation 1110 as illustrated in FIG. 11, verify pulses are applied to verify the level of the programmed state. For example, the bias level information and the LP data can be updated based on a determination whether the information swapping process is performed as described above for the application of the verify pulses.

At operation 1112 as illustrated in FIG. 11, it is determined whether all the levels of the programmed states are programmed and pass the verification. Responsive to all the levels of the programmed states are programmed and pass the verification (e.g., LV0, LV1, ..., LV7 for a TLC memory device are programmed and verified), method 1100 ends. Otherwise, method 1100 may return to operation 1104 to select another level of a programmed state to be programmed and verified.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A memory device, comprising:
a plurality of memory cells; and
a peripheral circuit coupled to the plurality of memory cells and comprising:
a page buffer comprising at least a page buffer circuit that is coupled to the plurality of memory cells, the page buffer circuit comprising a dynamic storage unit and a first non-dynamic storage unit; and
control logic coupled to the page buffer circuit and configured to:
determine whether an information swapping process is performed between the dynamic storage unit and the first non-dynamic storage unit; and
perform the operation on the page buffer circuit based on the determining whether the information swapping process is performed,
wherein a first set of information and a second set of information are initially stored in the dynamic storage unit and the first non-dynamic storage unit, respectively, and
wherein the control logic is configured to perform the information swapping process by swapping the first and second sets of information between the dynamic storage unit and the first non-dynamic storage unit.

2. The memory device of claim 1, wherein:
the page buffer circuit further comprises a sensing node, and the dynamic storage unit and the first non-dynamic storage unit are coupled to the sensing node; and
the dynamic storage unit and the non-dynamic storage unit are coupled through a connection circuit.

3. The memory device of claim 1, wherein the control logic is further configured to refresh the dynamic storage unit by performing the information swapping process in a predetermined time interval.

4. The memory device of claim 1, wherein to swap the first and second sets of information, the control logic is further configured to:
configure the page buffer circuit to modify a potential of a sensing node based on the first set of information in the dynamic storage unit;
re-store the second set of information in the first non-dynamic storage unit into the dynamic storage unit; and
configure the page buffer circuit to re-store the first set of information into the first non-dynamic storage unit based on the potential of the sensing node.

5. The memory device of claim 1, wherein the control logic is further configured to determine whether the information swapping process is performed between the dynamic storage unit and the first non-dynamic storage unit based on an information storage manner between the dynamic storage unit and the first non-dynamic storage unit, and
wherein the information storage manner indicates one of the followings:
the first set of information is stored in the dynamic storage unit, and the second set of information is stored in the first non-dynamic storage unit; or
the first set of information is stored in the first non-dynamic storage unit, and the second set of information is stored in the dynamic storage unit.

6. The memory device of claim 5, wherein the control logic is further configured to determine whether the information swapping process is performed between the dynamic storage unit and the first non-dynamic storage unit further based on a type of an operation to be performed on the page buffer circuit, and
wherein the type of the operation comprises at least one of updating the first set of information, reading out the first set of information, updating the second set of information, or reading out the second set of information.

7. The memory device of claim 6, wherein responsive to the type of the operation comprising updating the first set of information, to determine whether the information swapping process is performed, the control logic is further configured to:
determine whether the first set of information is stored in the dynamic storage unit or the first non-dynamic storage unit;
responsive to the first set of information being stored in the first non-dynamic storage unit, determine not to perform the information swapping process between the dynamic storage unit and the first non-dynamic storage unit; or
responsive to the first set of information being stored in the dynamic storage unit, determine to perform the information swapping process between the dynamic storage unit and the first non-dynamic storage unit.

8. The memory device of claim 7, wherein to perform the operation on the page buffer circuit, the control logic is further configured to:
responsive to determining not to perform the information swapping process when the first set of information is stored in the first non-dynamic storage unit, update the first set of information on the first non-dynamic storage unit; or
responsive to determining to perform the information swapping process when the first set of information is stored in the dynamic storage unit,
perform the information swapping process to re-store the first set of information from the dynamic storage unit to the first non-dynamic storage unit; and
update the first set of information on the first non-dynamic storage unit.

9. The memory device of claim 6, wherein responsive to the type of the operation comprising reading out the first set of information, to determine whether the information swapping process is performed, the control logic is further configured to:
determine whether the first set of information is stored in the dynamic storage unit or the first non-dynamic storage unit;
responsive to the first set of information being stored in the first non-dynamic storage unit, determine to perform the information swapping process between the dynamic storage unit and the first non-dynamic storage unit; or
responsive to the first set of information being stored in the dynamic storage unit, determine not to perform the information swapping process between the dynamic storage unit and the first non-dynamic storage unit.

10. The memory device of claim 9, wherein to perform the operation on the page buffer circuit, the control logic is further configured to:
responsive to determining to perform the information swapping process when the first set of information is stored in the first non-dynamic storage unit,
perform the information swapping process to re-store the first set of information from the first non-dynamic storage unit to the dynamic storage unit; and
read out the first set of information from the dynamic storage unit; or
responsive to determining not to perform the information swapping process when the first set of information is stored in the dynamic storage unit, read out the first set of information from dynamic storage unit.

11. The memory device of claim 6, wherein:
the page buffer circuit further comprises a second non-dynamic storage unit; and
the type of the operation comprises updating a third set of information stored in the second non-dynamic storage unit.

12. The memory device of claim 11, wherein to determine whether the information swapping process is performed, the control logic is further configured:
determine whether the second set of information is stored in the dynamic storage unit or the first non-dynamic storage unit;
responsive to the second set of information being stored in the first non-dynamic storage unit, determine not to perform the information swapping process between the dynamic storage unit and the first non-dynamic storage unit; or
responsive to the second set of information being stored in the dynamic storage unit, determine to perform the information swapping process between the dynamic storage unit and the first non-dynamic storage unit.

13. The memory device of claim 12, wherein to perform the operation on the page buffer circuit, the control logic is further configured to:
responsive to determining not to perform the information swapping process when the second set of information is stored in the first non-dynamic storage unit,
update the second set of information on the first non-dynamic storage unit; and
update the third set of information on the second non-dynamic storage unit based on the updated second set of information; or
responsive to determining to perform the information swapping process when the second set of information is stored in the dynamic storage unit,
perform the information swapping process to re-store the second set of information from the dynamic storage unit to the first non-dynamic storage unit;
update the second set of information on the first non-dynamic storage unit; and
update the third set of information on the second non-dynamic storage unit based on the updated second set of information.

14. The memory device of claim 11, wherein:
the first set of information comprises bias level information;
the second set of information comprises a portion of page data; and
the third set of information comprises inhibit information.

15. The memory device of claim 11, wherein:
each memory cell is configured to be programmed with a set of N-bits data, wherein N is an integer equal to or greater than 2;
the first non-dynamic storage unit comprises a bias level storage unit;
the second non-dynamic storage unit comprises a sensing storage unit; and the page buffer circuit further comprises a cache storage unit and N–2 data storage units.

16. A memory system, comprising:
a memory device configured to store data and comprising:
   a plurality of memory cells; and
   a peripheral circuit coupled to the plurality of memory cells and comprising:
      a page buffer comprising at least a page buffer circuit that is coupled to the plurality of memory cells, the page buffer circuit comprising a dynamic storage unit and a first non-dynamic storage unit; and
      control logic coupled to the page buffer circuit and configured to:
         determine whether an information swapping process is performed between the dynamic storage unit and the first non-dynamic storage unit; and
         perform the operation on the page buffer circuit based on the determining whether the information swapping process is performed; and
a memory controller coupled to the memory device and configured to control the memory device,
wherein a first set of information and a second set of information are initially stored in the dynamic storage unit and the first non-dynamic storage unit, respectively, and
wherein the control logic is configured to perform the information swapping process by swapping the first and second sets of information between the dynamic storage unit and the first non-dynamic storage unit.

17. A method for operating a memory device comprising a plurality of memory cells coupled to a page buffer circuit in a page buffer, the page buffer circuit comprising a dynamic storage unit and a first non-dynamic storage units, the method comprising:
   determining whether an information swapping process is performed between the dynamic storage unit and the first non-dynamic storage unit; and
   performing the operation on the page buffer circuit based on the determining whether the information swapping process is performed,
wherein a first set of information and a second set of information are initially stored in the dynamic storage unit and the first non-dynamic storage unit, respectively, and
wherein the information swapping process is performed by swapping the first and second sets of information between the dynamic storage unit and the first non-dynamic storage unit.

18. The method of claim 17, further comprising refreshing the dynamic storage unit by performing the information swapping process in a predetermined time interval.

19. The method of claim 17, wherein:
swapping the first and second sets of information comprises:
   configuring the page buffer circuit to modify a potential of a sensing node based on the first set of information in the dynamic storage unit;
   restoring the second set of information in the first non-dynamic storage unit into the dynamic storage unit; and
   configuring the page buffer circuit to re-store the first set of information into the first non-dynamic storage unit based on the potential of the sensing node.

20. The method of claim 17, wherein performing the operation on the page buffer circuit comprises:
   responsive to determining not to perform the information swapping process when the first set of information is stored in the first non-dynamic storage unit, updating the first set of information on the first non-dynamic storage unit; or
   responsive to determining to perform the information swapping process when the first set of information is stored in the dynamic storage unit,
      performing the information swapping process to re-store the first set of information from the dynamic storage unit to the first non-dynamic storage unit; and
      updating the first set of information on the first non-dynamic storage unit.

* * * * *